(12) United States Patent  (10) Patent No.: US 8,376,129 B2
Kimura et al.  (45) Date of Patent: Feb. 19, 2013

(54) COMPONENT MOUNTING APPARATUS, MOUNTING-COMPONENT PRODUCING METHOD, AND CONVEYOR APPARATUS

(75) Inventors: Akira Kimura, Tokyo (JP); Katsuhiko Ohno, Kanagawa (JP); Atsushi Saito, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/453,558

(22) Filed: Apr. 23, 2012

(65) Prior Publication Data

US 2012/0267216 A1  Oct. 25, 2012

Related U.S. Application Data

(62) Division of application No. 12/382,323, filed on Mar. 13, 2009, now Pat. No. 8,162,128.

(30) Foreign Application Priority Data

Apr. 8, 2008 (JP) ................................. 2008-100113

(51) Int. Cl.
B65G 21/20 (2006.01)
(52) U.S. Cl. .................................... 198/836.3
(58) Field of Classification Search ................ 198/836.3
See application file for complete search history.

(56) References Cited

U.S. PATENT DOCUMENTS

| | | | | |
|---|---|---|---|---|
| 3,339,916 | A * | 9/1967 | Tregay | 271/170 |
| 3,369,804 | A * | 2/1968 | Schulze et al. | 271/21 |
| 4,825,808 | A | 5/1989 | Takahashi et al. | |
| 4,907,792 | A * | 3/1990 | Washiashi et al. | 271/240 |
| 4,908,673 | A * | 3/1990 | Muramatsu | 399/402 |
| 5,682,976 | A * | 11/1997 | Jorgensen | 198/836.3 |
| 5,695,564 | A | 12/1997 | Imahashi | |
| 5,730,574 | A | 3/1998 | Adachi et al. | |
| 5,782,339 | A * | 7/1998 | Drewitz | 198/836.3 |
| 5,988,353 | A | 11/1999 | Asai et al. | |
| 6,019,564 | A | 2/2000 | Kiyokawa et al. | |
| 6,321,898 | B1 | 11/2001 | Inoue et al. | |
| 6,378,695 | B1 * | 4/2002 | Rinne | 198/836.3 |
| 6,415,904 | B1 | 7/2002 | Markiewicz | |
| 6,467,158 | B1 | 10/2002 | Kiyomura et al. | |
| 6,523,823 | B1 * | 2/2003 | Bakoledis | 271/223 |

(Continued)

FOREIGN PATENT DOCUMENTS

JP 11-286318 A 10/1999
JP 2007-227617 9/2007

OTHER PUBLICATIONS

Japanese Office Action issued May 11, 2010 for corresponding Japanese Application No. 2008-100113.

*Primary Examiner* — Douglas Hess
(74) *Attorney, Agent, or Firm* — Rader, Fishman & Grauer PLLC

(57) ABSTRACT

A conveyor apparatus includes a conveyor portion, a side member having first and second side members, a connecting member, a first locking member and a driving unit. The first locking mechanism attached to the second side member locks and unlocks a connection between the second side member and the connecting member. In an unlocked state, the second member is movable along the connecting member towards or away from the first member. In a locked state, the second member is immovable relative to the first member. The driving unit is operative to move the second side member along the first direction close to or away from the first side member when the first locking mechanism is in the unlocked state and is operative to move the conveyor portion, the side member and the connecting member in unison along the first direction when the first locking mechanism is in the locked state.

2 Claims, 15 Drawing Sheets

U.S. PATENT DOCUMENTS

| | | |
|---|---|---|
| 6,895,661 B1 | 5/2005 | Gamel et al. |
| 7,178,665 B2 * | 2/2007 | Ryan .......................... 198/860.1 |
| 7,185,422 B2 | 3/2007 | Sakai et al. |
| 7,222,414 B2 | 5/2007 | Gamel et al. |
| 7,367,115 B2 | 5/2008 | Nakai et al. |
| 7,721,876 B2 * | 5/2010 | Hartness et al. ........... 198/836.3 |
| 8,025,141 B1 * | 9/2011 | Bouldin ..................... 198/345.1 |
| 8,162,128 B2 * | 4/2012 | Kimura et al. ............. 198/468.3 |

* cited by examiner

US 8,376,129 B2

COMPONENT MOUNTING APPARATUS, MOUNTING-COMPONENT PRODUCING METHOD, AND CONVEYOR APPARATUS

CROSS REFERENCE TO RELATED APPLICATIONS

This is a Divisional Application of U.S. patent application Ser. No. 12/382,323, filed Mar. 13, 2009, which claims priority from Japanese Application No.: 2008-100113, filed on Apr. 8, 2008, the entire contents of which are incorporated herein by reference.

BACKGROUND OF THE INVENTION

1. Field of the Invention

The present invention relates to a component mounting apparatus for mounting a component such as an electronic component on a circuit board or the like, a method of producing the mounting component, and a conveyor apparatus typically used in the component mounting apparatus.

2. Description of the Related Art

From the past, a mounting apparatus for mounting an electronic component on a substrate includes a horizontally-moving head that holds the electronic component. A nozzle for absorbing the electronic component by vacuum suction, for example, is attached to the head. By a vertical movement of the nozzle, the nozzle is brought close to the substrate to thus mount the electronic component on the substrate (see, for example, Japanese Patent Application Laid-open No. 2007-227617 (paragraph [0047], FIGS. 5 to 7); hereinafter, referred to as Patent Document 1).

The mounting apparatus of Patent Document 1 includes, for example, four electronic-component supplying portions F1 to F4. Between the electronic-component supplying portions F1 and F2, the substrate is movable in a direction in which the electronic-component supplying portions F1 and F2 are arranged (y direction in FIG. 3 of Patent Document 1) by means of two substrate conveyors. Also between the electronic-component supplying portions F3 and F4, the substrate is movable in the y direction by means of two substrate conveyors. It should be noted that the substrate conveyors themselves cannot move in an x direction.

In a center column of the mounting apparatus, the four substrate conveyors move substrates P1 to P7 also in the x direction as shown in FIGS. 5 to 7. For example, the substrates are moved from one substrate conveyor to another in the x direction.

SUMMARY OF THE INVENTION

In the mounting apparatus of Patent Document 1, for example, as shown in FIG. 5A, after an electronic component is mounted on the substrate P1 in a first mounting area corresponding to the supplying portion F1, the substrate P1 is once moved to the center column. At the center column, the substrate P1 is moved from one substrate conveyor to another in the x direction. After that, the substrate P1 is moved to a third mounting area corresponding to the supplying portion F3 by the movement of that substrate conveyor so that an electronic component is mounted thereon in the third mounting area. At this time, as shown in FIG. 5D, an electronic component is mounted on the substrate P3 in the first mounting area. As described above, because the substrates are moved in the y direction to be conveyed to the respective mounting areas after being moved in the x direction at the center column, time losses in replacing the substrates in the mounting areas are large.

In view of the circumstances as described above, there is a need for a component mounting apparatus, a mounting-component producing method, and a conveyor apparatus used in the component mounting apparatus that are capable of shortening substrate replacement times in respective mounting areas.

Further, there is also a need for a conveyor apparatus capable of easily adjusting a conveyor width in accordance with a width of a substrate without any complicated mechanism.

According to an embodiment of the present invention, there is provided a component mounting apparatus including a load area, an unload area, a main area, two mounting units, a conveyor group, and a driving mechanism. The load area is for loading a substrate. The unload area is for unloading the substrate. The main area is interposed between the load area and the unload area and includes a first area that includes a first mounting area, a second area that is disposed opposite to the first area and includes a second mounting area, and a third area interposed between the first area and the second area. The two mounting units mount, on the substrate, a first component and a second component in the first mounting area and the second mounting area, respectively. The conveyor group conveys the substrate and includes a first conveyor, a second conveyor capable of receiving the substrate from the first conveyor in the first area, a third conveyor, and a fourth conveyor capable of receiving the substrate from the third conveyor in the second area. The driving mechanism is capable of moving at least one of the first conveyor and the second conveyor between the first area and the third area and moving at least one of the third conveyor and the fourth conveyor between the second area and the third area.

In such an embodiment, the substrate is conveyed between the first conveyor and the second conveyor disposed in the first area, and the substrate is conveyed between the third conveyor and the fourth conveyor disposed in the second area. For example, when the substrate is conveyed from the first conveyor to the second conveyor and an area in which at least the second conveyor is disposed is the first mounting area, the substrate replacement time in that first mounting area is shortened. In other words, unlike the mounting apparatus of Patent Document 1 that includes the mechanism in which the substrate is conveyed among the conveyors only at the center column, the component mounting apparatus according to the embodiment of the present invention can shorten the substrate replacement times.

Further, the driving mechanism moves at least one of the first conveyor and the second conveyor to the third area, for example. Accordingly, the conveyor group becomes capable of performing the following operations. For example, the first conveyor can receive the substrate from the load area. Alternatively, the substrate can be conveyed from the first conveyor to the second conveyor in the third area, or the substrate can be conveyed from the first (or third) conveyor to the fourth (or second) conveyor in the third area.

The first mounting area is all or a part of the first area. The second mounting area is all or a part of the second area. For example, areas to dispose the first conveyor and the second conveyor in the first area may both be the first mounting area, or one of the areas may be the first mounting area. The same holds true for the second mounting area of the second area.

The first component and the second component are typically different types of components or the same type but of different specifications. However, the components of the same type and specification may also be used.

The first area, the second area, and the third area are aligned in a second direction that crosses a first direction extending from the load area to the unload area. Because the first mounting area and the second mounting area are disposed on both sides in the second direction, mounting processing can be carried out efficiently in terms of substrate conveyance.

The expression "second direction that crosses a first direction" is not limited to the case where the first direction and the second direction are orthogonal, and the directions only need to cross each other at a substantial angle considering the purpose of the present invention.

The component mounting apparatus further includes a control means for controlling at least the driving mechanism so that, by aligning the first conveyor and the second conveyor in the first direction in the first area, aligning the third conveyor and the fourth conveyor in the first direction in the second area, aligning the first conveyor and the third conveyor in the second direction, and aligning the second conveyor and the fourth conveyor in the second direction, the first conveyor, the second conveyor, the third conveyor, and the fourth conveyor are arranged on both sides of the third area in a matrix. In this case, the third area includes a first buffer area interposed between the first conveyor disposed in the first area and the third conveyor disposed in the second area, and a second buffer area aligned with the first buffer area in the first direction and interposed between the second conveyor disposed in the first area and the fourth conveyor disposed in the second area. In other words, the first to fourth conveyors are arranged in a matrix, and the first buffer area and the second buffer area are arranged in correspondence with the matrix. Thus, the substrate is conveyed efficiently.

The driving mechanism disposes the first conveyor and the second conveyor in the first area such that the first conveyor and the second conveyor are aligned in a first direction extending from the load area to the unload area.

The driving mechanism disposes the third conveyor and the fourth conveyor in the second area such that the third conveyor and the fourth conveyor are aligned in the first direction.

The component mounting apparatus further includes a load conveyor that is disposed in the load area and conveys the substrate to the main area, and a load conveyor driving mechanism to move the load conveyor in the second direction. With such a structure, the load conveyor can convey the substrate to the first to third areas, for example, whereby substrate conveying efficiency is improved. Moreover, such a structure enhances general versatility of a connection between the component mounting apparatus and other apparatuses.

Similarly, the component mounting apparatus may further include an unload conveyor that is disposed in the unload area and receives the substrate from the main area, and an unload conveyor driving mechanism to move the unload conveyor in the second direction so that the unload conveyor receives the substrate from the third area and receives the substrate from at least one of the first area and the second area.

According to another embodiment of the present invention, there is provided a mounting-component producing method for a component mounting apparatus. The component mounting apparatus includes a load area, an unload area, a main area, and a conveyor group. The load area is for loading a substrate. The unload area is for unloading the substrate. The main area is interposed between the load area and the unload area and includes a first area that includes a first mounting area, a second area that is disposed opposite to the first area and includes a second mounting area, and a third area interposed between the first area and the second area, the first area, the second area, and the third area being aligned in a second direction that crosses a first direction extending from the load area to the unload area. The conveyor group conveys the substrate in the main area and includes a first conveyor, a second conveyor, a third conveyor, and a fourth conveyor. The mounting-component producing method includes: mounting a first component on the substrate in the first mounting area; moving at least one of the first conveyor and the second conveyor so that the first conveyor and the second conveyor are aligned in the first direction in the first area and the first conveyor is disposed on the load area side; receiving, by the second conveyor, the substrate from the first conveyor in the first area; mounting a second component on the substrate in the second mounting area; moving at least one of the third conveyor and the fourth conveyor so that the third conveyor and the fourth conveyor are aligned in the first direction in the second area and the third conveyor is disposed on the load area side; and receiving, by the fourth conveyor, the substrate from the third conveyor in the second area.

In such an embodiment, the substrate is conveyed from the first conveyor to the second conveyor in the first area including the first mounting area. Moreover, the substrate is conveyed from the third conveyor to the fourth conveyor in the second area including the second mounting area. Accordingly, substrate replacement times in the first mounting area and the second mounting area are shortened.

The preamble part is presented for clarifying the content of the embodiment of the present invention, and the inventors and applicants of the present invention have no intention of presenting it as a well-known technique.

The order in which the step of mounting the first component, the step of aligning the first conveyor and the second conveyor, and the step of receiving the substrate by the second conveyor are carried out is not particularly limited. Alternatively, the step of mounting the first component and the step of receiving the substrate by the second conveyor may temporally overlap. The same holds true for the step of mounting the second component, the step of aligning the third conveyor and the fourth conveyor, and the step of receiving the substrate by the fourth conveyor.

The mounting of the first component on the substrate includes mounting the first component on the substrate on the first conveyor. The mounting of the second component on the substrate includes mounting the second component on the substrate on the fourth conveyor.

The moving of at least one of the third conveyor and the fourth conveyor includes moving, while the second component is being mounted on a first substrate as the substrate on the fourth conveyor, the third conveyor that has received a second substrate as the substrate loaded in the load area after the first substrate is loaded, so that the third conveyor is aligned with the fourth conveyor. Accordingly, it is possible to convey the second substrate from the third conveyor to the fourth conveyor immediately after the second component is mounted on the first substrate on the fourth conveyor, and mount the second component on the second substrate on the fourth conveyor. Thus, the replacement time of the first substrate and the second substrate can be shortened.

The moving of at least one of the first conveyor and the second conveyor includes moving, while the first component is being mounted on a first substrate as the substrate on the first conveyor, a load conveyor to convey the substrate to the main area, that has received a second substrate as the substrate loaded in the load area after the first substrate is loaded, so that the load conveyor is aligned with the first conveyor, and moving, while the first component is being mounted on the first substrate as the substrate on the first conveyor, the second conveyor so that the second conveyor is aligned with the first conveyor. Accordingly, immediately after the second component is mounted on the first substrate on the first conveyor, the first substrate is conveyed from the first conveyor to the second conveyor, and the second substrate is conveyed from the load conveyor to the first conveyor. Thus, the replacement time of the first substrate and the second substrate can be shortened.

The mounting of the first component on the substrate includes mounting the first component on a second substrate as the substrate loaded in the load area after a first substrate as the substrate is loaded, on the second conveyor, and mounting the first component on a third substrate as the substrate loaded in the load area after the second substrate is loaded, on the first conveyor. The mounting of the second component on the substrate includes mounting the second component on the first substrate on the fourth conveyor, and mounting the second component on a fourth substrate as the substrate loaded in the load area after the third substrate is loaded, on the third conveyor.

The moving of at least one of the first conveyor and the second conveyor includes moving, while the second component is being mounted on the first substrate on the fourth conveyor and the first component is being mounted on the third substrate on the first conveyor, the second conveyor that has received the second substrate via the first conveyor so that the second conveyor is aligned with the first conveyor. The moving of at least one of the third conveyor and the fourth conveyor includes moving, while the second component is being mounted on the first substrate on the fourth conveyor and the first component is being mounted on the third substrate on the first conveyor, the third conveyor that has received the fourth substrate so that the third conveyor is aligned with the fourth conveyor. In this case, the mounting-component producing method further includes mounting the first component on the second substrate on the second conveyor, and mounting the second component on the fourth substrate on the third conveyor. Accordingly, immediately after the second component and the first component are respectively mounted on the first substrate and the third substrate on the fourth conveyor and the first conveyor, the first component and the second component are respectively mounted on the second substrate and the fourth substrate on the second conveyor and the third conveyor. Thus, the replacement time of the second substrate and the third substrate in the first area and the replacement time of the first substrate and the fourth substrate in the second area can be shortened.

According to another embodiment of the present invention, there is provided a conveyor apparatus including a conveyor portion, a side member, a driving unit, a connecting member, and a first locking mechanism. The conveyor portion supports and conveys a substrate. The side member includes a first side member and a second side member opposed to the first side member, the side member being connected to the conveyor portion such that the substrate supported by the conveyor portion is placed between the first side member and the second side member. The driving unit moves the second side member close to and away from the first side member. The connecting member includes an end portion fixed to the first side member and connects the first side member and the second side member. The first locking mechanism is attached to the second side member and locks and unlocks a connection between the second side member and the connecting member.

By the driving unit moving the second side member when the connection between the second side member and the connecting member is locked by the first locking mechanism, the first side member and the second side member move integrally. In other words, in this case, the conveyor portion, the side member, and the like can be moved integrally in a direction in which the second side member moves.

On the other hand, when the connection between the second side member and the connecting member is in an unlocked state by the first locking mechanism, the second side member moves close to and away from the first side member by the driving unit. Accordingly, a distance between the first side member and the second side member is adjusted in accordance with a width of the substrate, which will hereinafter be referred to as width adjustment.

By an operator electrically inputting an operation to a driving source such as a motor included in the driving unit, the driving unit is driven. Alternatively, the operator may manually drive the driving unit without electrically inputting an operation.

As described below, the first side member may be locked and unlocked by the second locking mechanism. Alternatively, the first side member may be locked (fixed) by an input of the operator when the width adjustment above is carried out.

The conveyor apparatus further includes a second locking mechanism to lock and unlock a connection between the first side member and an installing portion at which the conveyor apparatus is installed. In this case, the "installing portion" is an element excluded from the conveyor apparatus.

According to the embodiments of the present invention, the substrate replacement times in the mounting areas can be shortened.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will be described with reference to the drawings.

Figure 1:
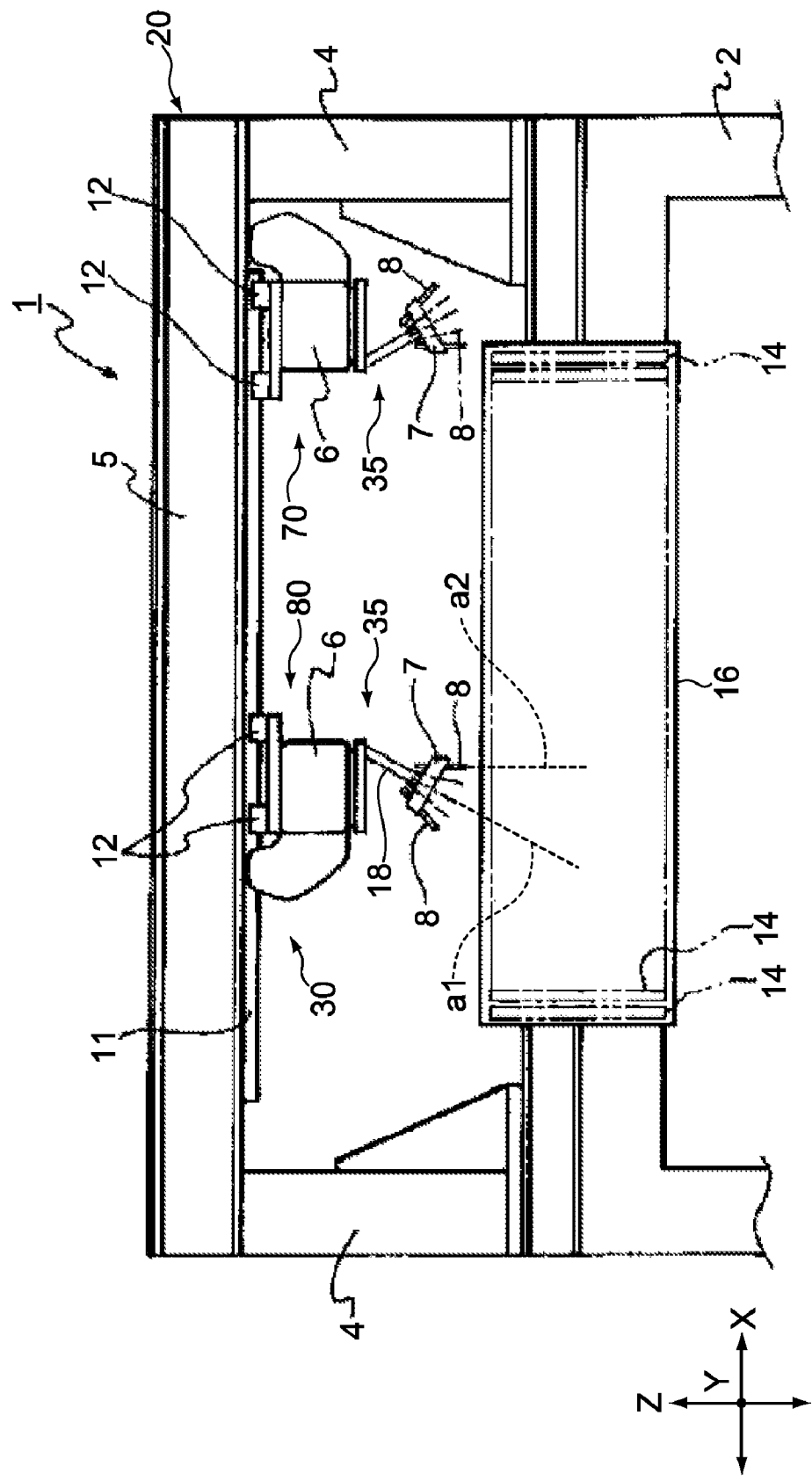
FIG. 1 is a front view of a component mounting apparatus according to an embodiment of the present invention.
Figure 2:
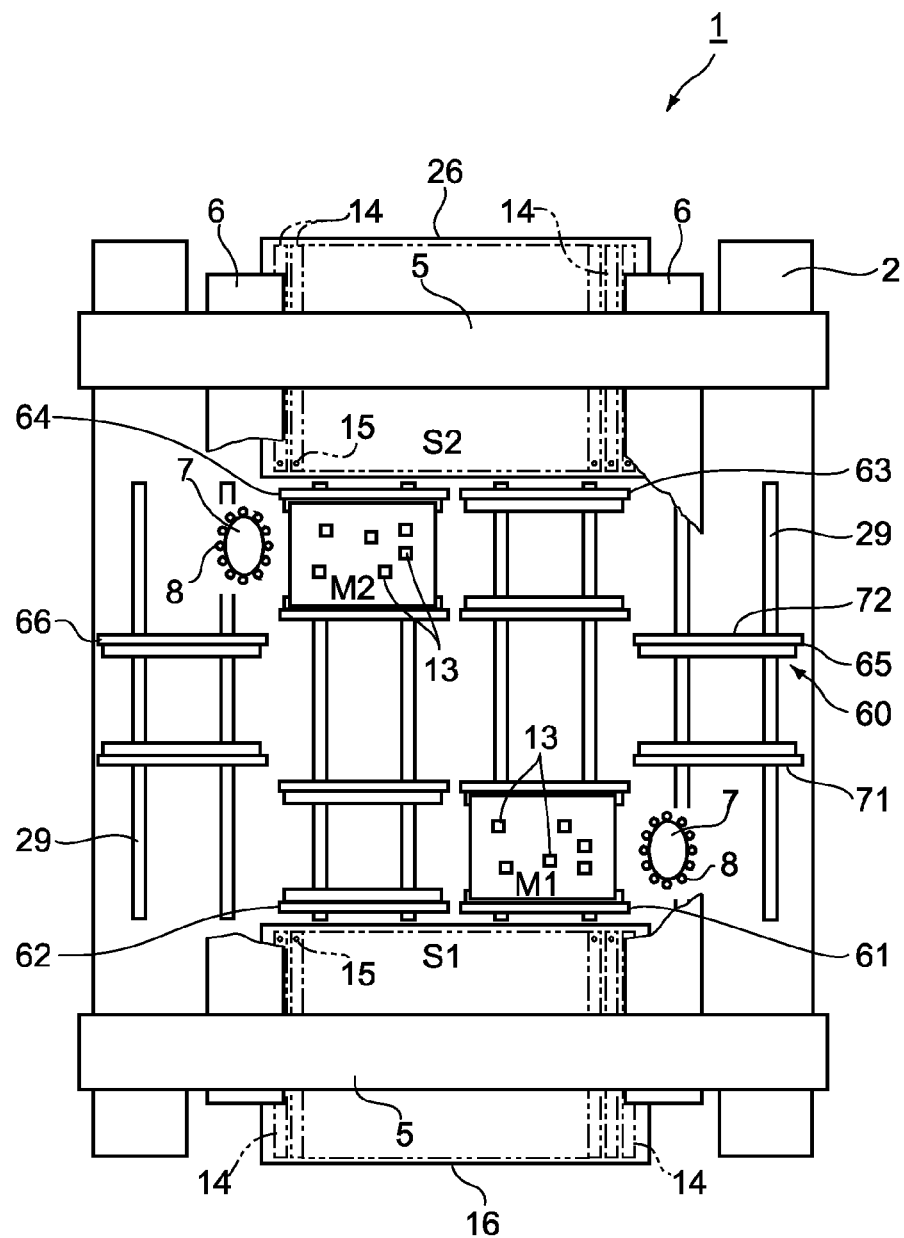
FIG. 2 is a plan view of the partially-fractured component mounting apparatus.
Figure 3:
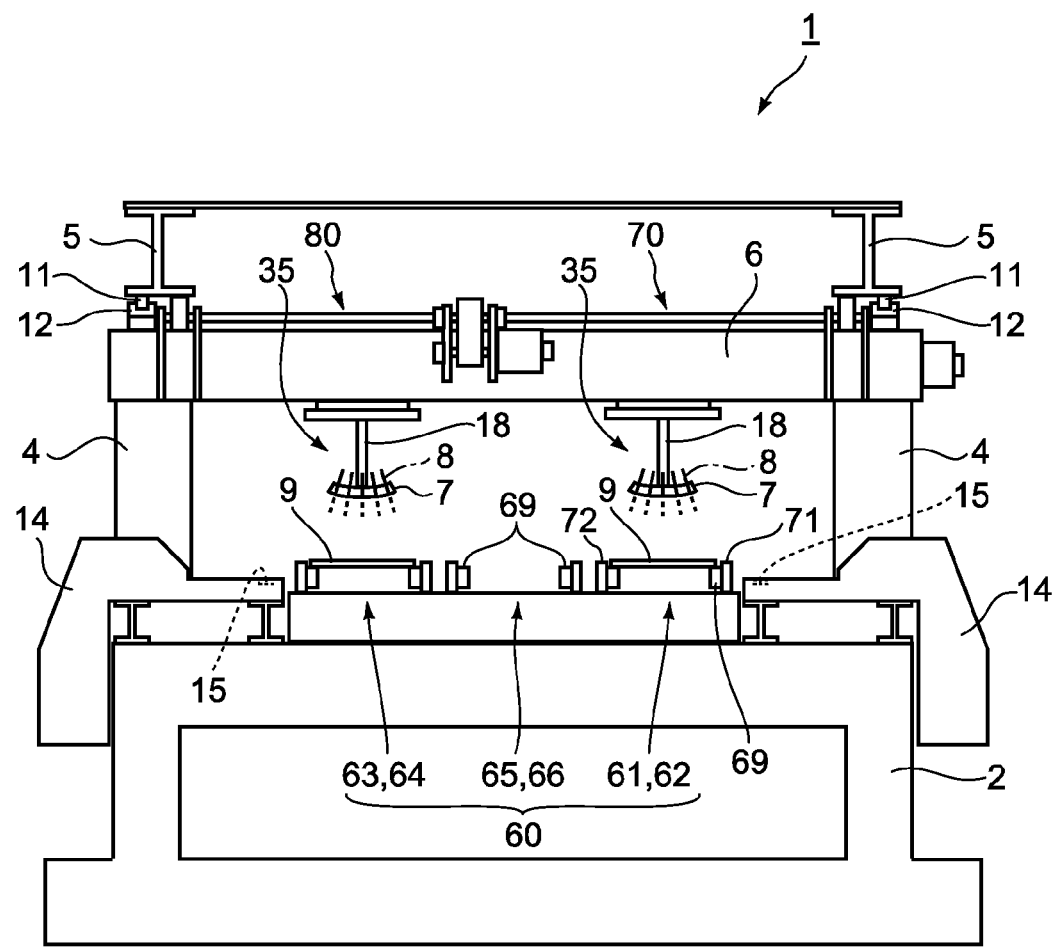
FIG. 3 is a side view of the component mounting apparatus.
Figure 3:
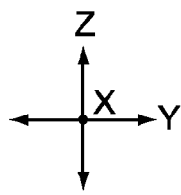
Figure 4:
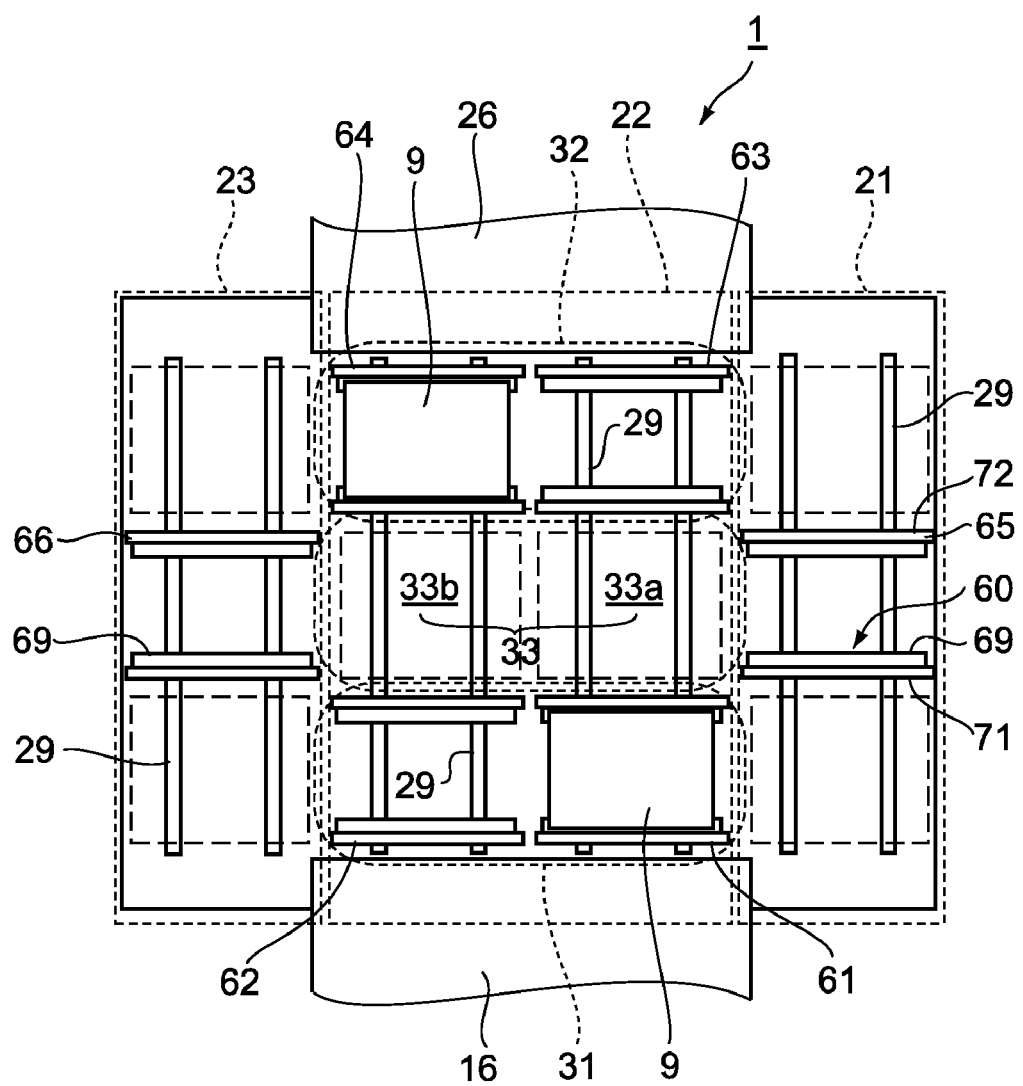
FIG. 4 is as plan view of the component mounting apparatus shown in FIG. 2, for explaining each area of the component mounting apparatus.

FIG. 1 is a front view of a component mounting apparatus 1 according to an embodiment of the present invention. FIG. 2 is a plan view of the partially-fractured component mounting apparatus 1. FIG. 3 is a side view of the component mounting apparatus 1. FIG. 4 is a plan view of the component mounting apparatus 1 shown in FIG. 2, for explaining each area of the component mounting apparatus 1.

As shown in FIG. 4, the component mounting apparatus 1 includes, along a direction in which a circuit board (hereinafter, simply referred to as substrate) 9 flows, that is, an X-axis direction in FIG. 4, a load area 21, a main area 22, and an unload area 23.

A load conveyor 65 that loads the substrates 9 from outside the component mounting apparatus 1 and conveys the loaded substrates 9 to the main area 22 is disposed in the load area 21. A conveyor group including first to fourth conveyors 61 to 64 is disposed in the main area 22. The substrates 9 move in the main area 22 by means of the conveyor group, and are disposed at respective positions in the main area 22 as will be described later. An unload conveyor 66 is disposed in the unload area 23. The substrates 9 are conveyed from the main area 22 and unloaded to the outside of the component mounting apparatus 1 by the unload conveyor 66. It should be noted that FIG. 2 exemplifies a state where the substrates 9 are respectively mounted on the first and fourth conveyors 61 and 64.

Typically, the load conveyor 65, the unload conveyor 66, and the first to fourth conveyors 61 to 64 only need to have the same structure. Therefore, in descriptions below, unless there is a need to distinguish the load conveyor 65, the unload conveyor 66, and the first to fourth conveyors 61 to 64 from one another in particular, only a single conveyor among the load conveyor 65, the unload conveyor 66, and the first to fourth conveyors 61 to 64 will be focused upon, and that conveyor will be simply referred to as "conveyor 60".

The conveyor 60 includes, for example, a supporting portion (conveyor portion) 69 for supporting the substrate 9 from the bottom. By moving the supporting portion 69 in the X-axis direction, the substrate 9 is conveyed in the X-axis direction. A structure for moving the supporting portion 69 is typically a well-known structure such as a driving mechanism or the like that uses a belt or a chain, but may be other well-known structures. Further, as shown in FIGS. 2 and 4, the conveyor 60 includes a pair of side plates 71 and 72. The pair of side plates 71 and 72 are provided to the conveyor portion that uses the belt or chain driving mechanism or the like such that the substrate 9 is disposed between the pair of side plates 71 and 72.

Furthermore, as will be described later, the conveyor 60 itself moves in a Y-axis direction by a conveyor driving unit (driving mechanism).

It should be noted that in factories, the component mounting apparatus 1 is connected to an external apparatus (not shown) in some cases. Examples of the external apparatus include another component mounting apparatus, a cream solder printing apparatus, an inspecting apparatus, and a reflow apparatus. There are cases where a plurality of component mounting apparatuses 1 are prepared and connected to one another. This is when there are a lot of different types of electronic components to be mounted on a single substrate 9.

The component mounting apparatus 1 includes a base portion 2 and a frame structure 20 supported by the base portion 2. The frame structure 20 includes a plurality of supporting columns 4 erected on the base portion 2, and a beam 5 bridged between, for example, two supporting columns 4. With four supporting columns 4, for example, two beams 5 are provided.

The frame structure 20 is provided with two mounting units 70 and 80 for mounting electronic components 13 on the substrates 9. The two mounting units 70 and 80 have the same structure. Therefore, unless there is a need to specifically focus on both of the mounting units 70 and 80, descriptions will be given on only the mounting unit 70 in describing the structure of the mounting units 70 and 80 hereinafter.

The mounting unit 70 includes a head 35 for holding the electronic component 13 and a head driving mechanism 30 for moving the head 35.

Typically, the head driving mechanism 30 includes a moving member 6 extending in the Y-axis direction and movable in the X-axis direction, guided bodies 12 fixed on an upper surface of the moving member 6 at both end portions, and a rail 11 that extends in the X-axis direction on a lower surface of the beam 5 and guides a movement of the guided bodies 12. The rail 11 is commonly used by the two heads 35 (and two moving members 6). However, it is also possible to provide the rail 11 for each of the heads 35 (and two moving members 6).

With the structure of the head driving mechanism 30 as described above, the moving member 6 is movable in the X-axis direction along the beam 5. Moreover, the head 35 connected to the moving member 6 is also movable in the X-axis direction. It should be noted that a ball screw driving mechanism, a belt (or chain) driving mechanism, a linear motor driving mechanism, or other driving mechanisms only needs to be used as a driving system for moving the moving member 6 as will be described later.

Typically, the head 35 includes a plurality of sucking nozzles 8, a nozzle holding portion 7 for holding the sucking nozzles 8, and a supporting portion 18 for supporting the nozzle holding portion 7. The supporting portion 18 is connected to the moving member 6, and the head 35 is thus movable in the Y-axis direction by driving of a ball screw provided inside the moving member 6. Also in this case, a belt (or chain) driving mechanism, a linear motor driving mechanism, or other driving mechanisms may be used instead of the ball screw driving mechanism.

With the structure as described above, the head 35 is movable within an X-Y plane.

The nozzle holding portion 7 is hanged from the supporting portion 18. The nozzle holding portion 7 is rotatable in both the positive and negative directions by a built-in motor (not shown). As shown in FIG. 1, a main rotary axis a1 of the nozzle holding portion 7 is tilted with respect to the Z-axis direction.

The nozzle holding portion 7 is provided with, for example, at an outer circumferential portion thereof, 12 sucking nozzles 8 disposed at regular intervals in a circumferential direction. Each of the sucking nozzles 8 is mounted to the nozzle holding portion 7 so that an axis line thereof is tilted with respect to the main rotary axis a1 of the nozzle holding portion 7. The tilt is made such that an upper end of the sucking nozzle 8 comes closer to the main rotary axis a1 of the nozzle holding portion 7 than a lower end thereof. In other words, as a whole, the 12 sucking nozzles 8 are provided to the nozzle holding portion 7 so as to be widened toward the end.

Each of the sucking nozzles 8 is supported by the nozzle holding portion 7 to be movable in an axial direction, and is lowered by being pressed downward by a pressing mechanism (not shown) when the sucking nozzle 8 is positioned at an operating position to be described later. The pressing mechanism may be any mechanism such as a cam mechanism, a ball screw mechanism, a solenoid, and an air pressure generating mechanism.

Regarding the head 35 of the mounting unit 80, the axis line of the sucking nozzle 8 at a far right end in FIG. 1 faces the Z-axis direction, and the sucking nozzle 8 at the far right end corresponds to the operating position. The electronic component 13 is sucked or released by the sucking nozzle 8 positioned at the operating position and facing the vertical direction.

There are a plurality of types of electronic components 13 to be mounted on a single substrate 9, but different types of electronic components 13 cannot be sucked and mounted by a single type of sucking nozzle 8. In this regard, a plurality of types of sucking nozzles 8 are provided to suck and mount electronic components 13 respectively corresponding to optimal sucking nozzles 8. Examples of the electronic component 13 include various components such as an IC chip, a resistor, a condenser, and a coil.

The sucking nozzle 8 is connected to an air compressor (not shown), for example, and a tip end portion of the sucking nozzle 8 positioned at the operating position is switched between a positive pressure and a negative pressure at predetermined timings. Accordingly, the tip end portion sucks or releases the electronic component 13.

As shown in FIG. 4, the main area 22 includes a first area 31 including a first mounting area, a second area 32 including a second mounting area, and a buffer area 33 (third area) interposed between the first area 31 and the second area 32. The first area 31, the second area 32, and the buffer area 33 are aligned in the Y-axis direction.

As shown in FIG. 2, the component mounting apparatus 1 includes arranging portions 16 and 26 provided on both sides of the main area 22 in the Y-axis direction and at which component supplying apparatuses 14 are disposed. The arranging portion 16 is adjacent to the first area 31 and the arranging portion 26 is adjacent to the second area 32. On the arranging portion 16, a plurality of component supplying apparatuses 14 are arranged in the X-axis direction while being detachable at predetermined positions on the arranging portion 16. Also on the arranging portion 26, the plurality of component supplying apparatuses 14 are arranged in the X-axis direction while being detachable at predetermined positions on the arranging portion 26. Each of the component supplying apparatuses 14 is typically a tape feeder that includes a carrier tape accommodating a large number of electronic components 13 of the same type, but is not limited thereto.

In the examples shown in FIGS. 2 and 4, for convenience of description, as an initial state of the component mounting apparatus 1, a state where the first and second conveyors 61 and 62 are arranged in the first area 31 and the third and fourth conveyors 63 and 64 are arranged in the second area 32 is shown. In other words, in the initial state shown in those figures, the first to fourth conveyors 61 to 64 are arranged in a matrix with the buffer area 33 interposed between the first area 31 and the second area 32. In this initial state, an area occupied by the substrate 9 placed on the first conveyor 61 mainly corresponds to a first mounting area M1. Further, in the initial state shown in FIGS. 2 and 4, an area occupied by the substrate 9 placed on the fourth conveyor 64 mainly corresponds to a second mounting area M2.

However, as will be described later, depending on the order in which the substrates 9 are conveyed by the conveyor group, the areas occupied by the substrates 9 placed on the first and second conveyors 61 and 62 in the initial state shown in FIGS. 2 and 4 may both be the first mounting area M1. Similarly, the areas occupied by the substrates 9 placed on the third and fourth conveyors 63 and 64 may both be the second mounting area M2.

Moreover, the position of the conveyor 60 in the initial state of the component mounting apparatus 1 is not limited to the example shown in FIGS. 2 and 4, and can be changed as appropriate.

The component supplying apparatuses 14 accommodate the electronic components 13 whose types are different for each of the component supplying apparatuses 14. Depending on which electronic component 13 is to be mounted at what position on the substrate 9, the sucking nozzle 8 and the component supplying apparatus 14 are selected to thus suck the electronic component 13.

Types of electronic components 13 supplied by the arranging portion 16 and types of electronic components 13 supplied by the arranging portion 26 may either be the same or different.

A component supplying port 15 is provided at one end portion of each of the component supplying apparatuses 14. Each of the component supplying apparatuses 14 is mounted on the corresponding one of the arranging portions 16 and 26 such that the end portion thereof to which the component supplying port 15 is provided faces the corresponding one of the first and second mounting areas M1 and M2. The sucking nozzle 8 extracts the electronic component 13 via the component supplying port 15. Areas of the sucking nozzles 8 when extracting the electronic components 13 as described above or the areas of the heads 35 at that time (area including operating positions) are set as component supplying areas S1 and S2. Regarding the head 35 of the mounting unit 70, the sucking nozzle 8 at the operating position moves inside the component supplying area S1, the first mounting area M1, and an area connecting those areas S1 and M1. Similarly, regarding the head 35 of the mounting unit 80, the sucking nozzle 8 at the operating position moves inside the component supplying area S2, the second mounting area M2, and an area connecting those areas S2 and M2.

First, the head 35 moves to the component supplying area S1 and sequentially sucks given electronic components 13 using 12 sucking nozzles 8 provided to the nozzle holding portion 7. Then, the head 35 moves to the component mounting area M1 and sequentially mounts the components sucked by the sucking nozzles 8 at predetermined positions on the substrate 9 while movements thereof in the X- and Y-axis directions are adjusted. The head 35 is moved in the X- and Y-axis directions by the moving member 6 and the supporting portion 18 described above. By repeating this operation, the electronic components 13 are mounted on the substrate 9.

As shown in FIGS. 2 to 4, a plurality of linear guide rails 29 for moving the conveyors 60 in the Y-axis direction are laid on the base portion 2. The component mounting apparatus 1 includes a controller (not shown) and a conveyor driving unit (not shown) for moving the conveyors 61 to 66 in response to control signals from the controller. The conveyor driving unit drives the first to fourth conveyors 61 to 64, the load conveyor 65, and the unload conveyor 66 individually. As the conveyor driving unit, a rack-and-pinion driving unit, a ball screw driving unit, a belt (or chain) driving unit, a linear motor driving unit, or the like (all of which are not shown) is used. The conveyor driving unit is provided for each conveyor 60.

Due to the conveyor driving unit and the linear guide rails 29 as described above, the load conveyor 65 and the unload conveyor 66 respectively move across entire surfaces of the load area 21 and the unload area 23. Further, in the main area 22, the first and second conveyors 61 and 62 move to the buffer area 33 and the third and fourth conveyors 63 and 64 move to the buffer area 33.

In the buffer area 33, an area at which the first conveyor 61 or the third conveyor 63 is disposed is referred to as first buffer area 33*a*. In addition, an area at which the second conveyor 62 or the fourth conveyor 64 is disposed is referred to as second buffer area 33*b*.

The controller includes a structure for realizing information processing, such as a CPU (Central Processing Unit), a ROM (Read Only Memory), and a RAM (Random Access Memory). The ROM or other storage devices store predetermined programs. The predetermined programs include a program related to an operational sequence of the conveyors 60, for example. Instead of software, hardware or firmware may be used as a structure for realizing a function on the operational sequence of the conveyors 60. It is also possible to use a DSP (Digital Signal Processor), an FPGA (Field Programmable Gate Array), an ASIC (Application Specific Integrated Circuit), or the like instead of the CPU.

With such a structure, the controller switches start and stop of the movement of the conveyors 60 by the conveyor driving unit, and controls timings thereof. Moreover, the controller controls the operational sequence of the conveyors 60, switches start and stop of conveyance of the substrates 9 of the conveyors themselves, and controls timings thereof.

Next, an operation of the thus-structured component mounting apparatus 1 will be described. As a typical embodiment of the flow, the following three flows will be described; (1) "Z-type flow", (2) "parallel-type flow", and (3) "X-type flow".

1. Descriptions on Z-Type Flow

Figure 5A:
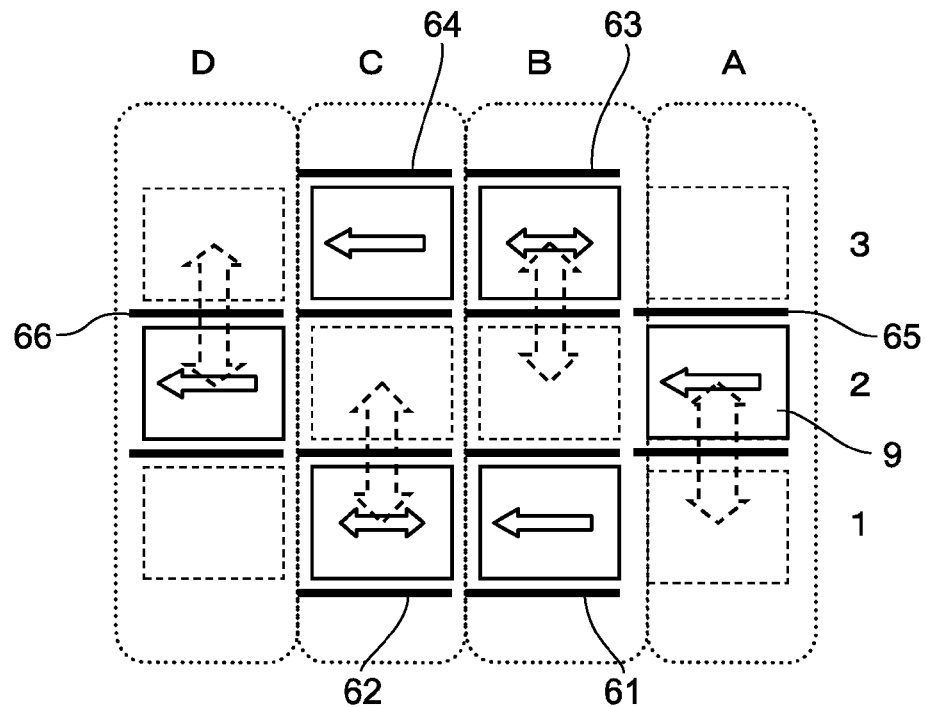
FIG. 5A is a diagram showing a moving range of each conveyor in a Z-type flow.
Figure 5B:
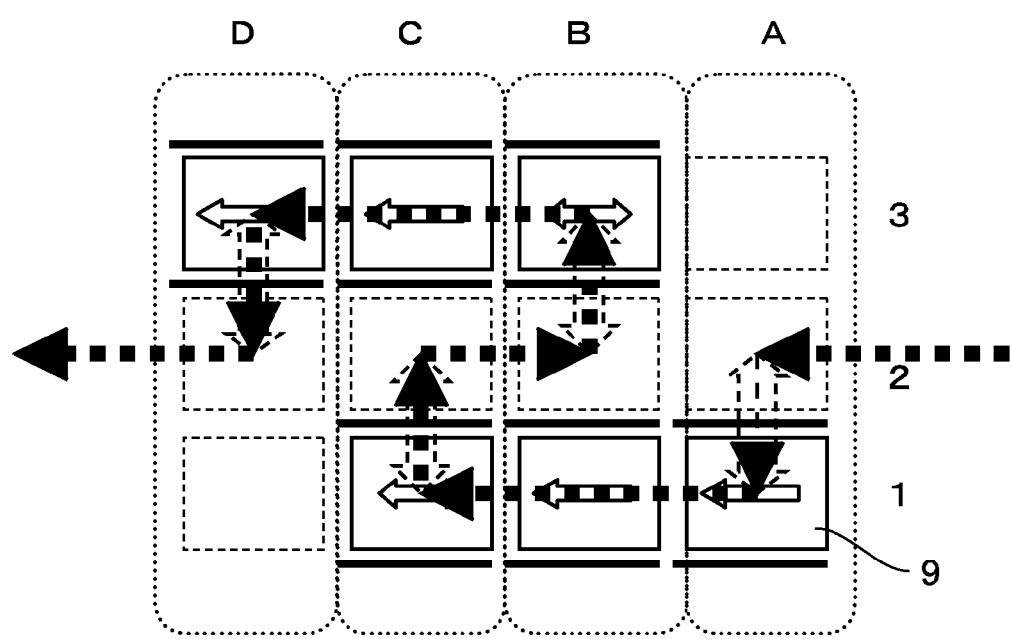
FIG. 5B is a diagram showing a direction in which a single substrate flows in the Z-type flow.

FIG. 5A is a diagram showing a moving range of the conveyors 60 in the Z-type flow, and FIG. 5B is a diagram showing a direction in which a single substrate 9 flows in the Z-type flow.

In FIG. 5A, arrows indicated by broken lines each indicate a moving range of the conveyor 60, and the first and fourth conveyors 61 and 64 having no arrows with broken lines means that they do not move. In this case, the first conveyor 61 conveys the substrate 9 to the second conveyor 62, and the fourth conveyor 64 receives the substrate 9 from the third conveyor 63. The conveyors 60 and the moving ranges thereof will be described using a matrix with row numbers 1 to 3 and column numbers A to D. In FIG. 5A, for example, a position at which the load conveyor 65 is disposed is Row 2, Column A, which is represented as (2, A).

The arrows with solid lines each indicate a direction in which the conveyor 60 itself conveys the substrate 9. In this example, the second conveyor 62 and the third conveyor 63 convey the substrates 9 in both positive and negative directions in the Y-axis direction.

As shown in FIG. 5B, because a trajectory of the flow of the substrate 9 is similar to the letter Z, the flow is called the Z-type flow for convenience.

Figure 6:
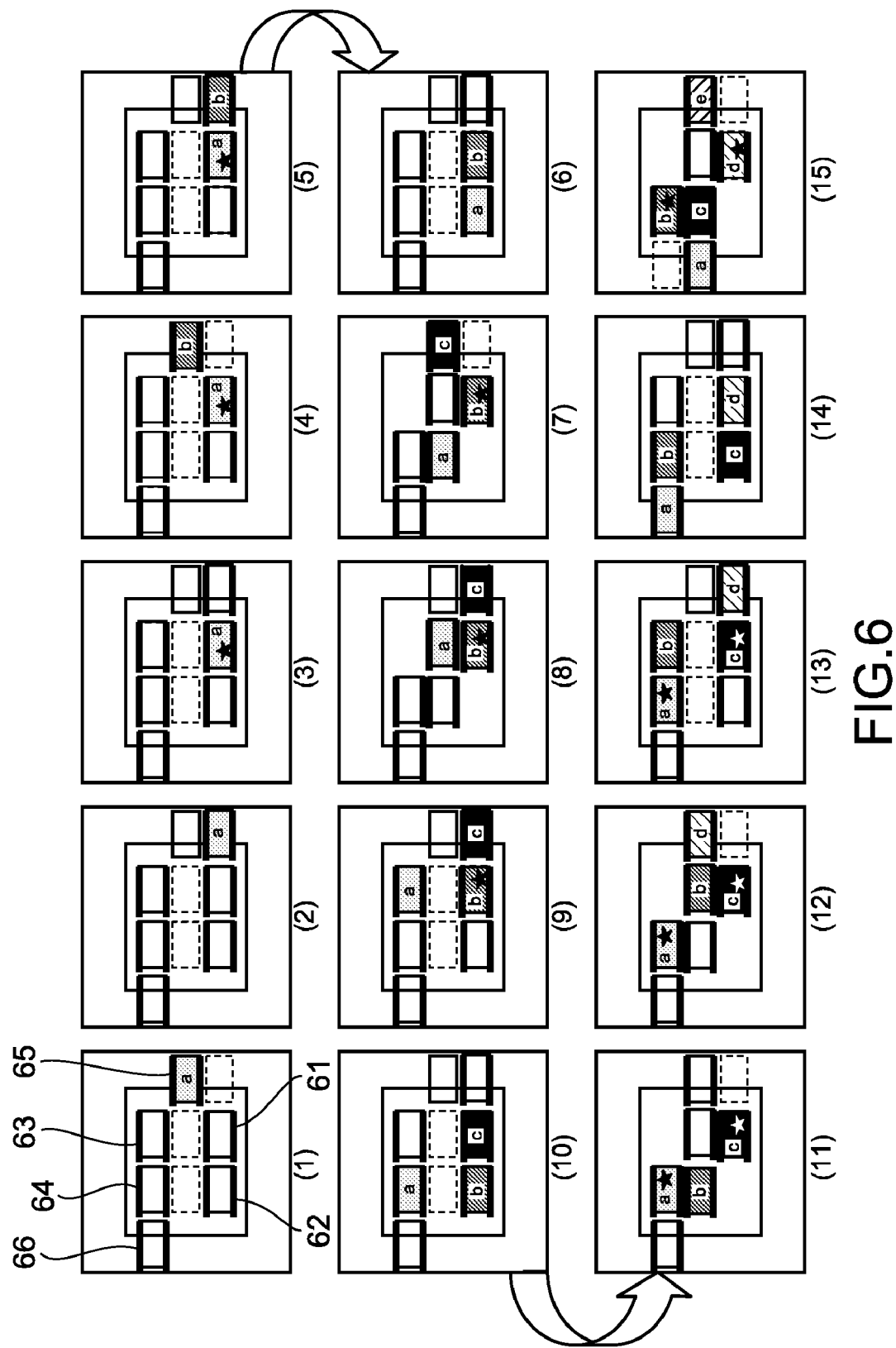
FIG. 6 is a diagram for specifically explaining the Z-type flow.

FIG. 6 is a diagram for specifically explaining the Z-type flow. It should be noted that in FIG. 6, time intervals of Sequences (1) to (15) are not necessarily constant.

Sequence (1)

First, a single substrate 9 (hereinafter, referred to as substrate a) is transferred to the load conveyor 65 so as to be loaded in the load area 21. The position of the load conveyor 65 at this time is typically (2, A). This is for ease in connection of the component mounting apparatus 1 with an external apparatus. The same holds true for the fact that the unload conveyor 66 is positioned at (2, D) as shown in Sequence (15). However, the position at which the load conveyor 65 receives the substrate 9 from the external apparatus and the position at which the unload conveyor 66 unloads the substrate 9 to the external apparatus may be (1, A) and (3, D), respectively, for example.

Sequence (2)

Upon receiving the substrate a, the load conveyor 65 moves to (1, A). The substrate a is conveyed from the load conveyor 65 to the first conveyor 61. A distance between the load conveyor 65 and the first conveyor 61 at this time is set as a gap small enough to give no influence on the conveyance of the substrate a. A distance between two of the other conveyors 60 like the first and second conveyors 61 and 62 is set in the same manner.

Sequence (3)

Upon receiving the substrate a, the first conveyor 61 stops the conveying operation of the first conveyor 61 itself. Thus, a range of the mounting surface of the substrate a placed on the first conveyor 61 positioned at (1, B) becomes the first mounting area M1 described above, and the electronic component 13 is mounted on the substrate a by the mounting unit 70, for example. A star mark in the first mounting area M1 (and second mounting area M2) indicates that the electronic component 13 has been mounted.

Sequences (4) and (5)

While the electronic component 13 is being mounted, a second substrate b is moved in the same manner as the substrate a by the load conveyor 65. In a case where the mounting processing on the substrate a in the first mounting area M1 is not yet ended when the load conveyor 65 on which the substrate b is placed is positioned at (1, A), the load conveyor 65 stops its own conveying operation so that the substrate b stands by at (1, A).

Sequence (6)

Upon end of the mounting processing on the substrate a in the first mounting area M1, the substrate a is conveyed from the first conveyor 61 to the second conveyor 62, and the substrate b is conveyed from the load conveyor 65 to the first conveyor 61.

Sequences (7) to (9)

The mounting processing on the substrate b in the first mounting area M1 is started. The second conveyor 62 on which the substrate a is placed moves to the second buffer area 33*b* (2, C), and the third conveyor 63 moves to the first buffer area 33*a* (2, B). Then, the substrate a is conveyed from the second conveyor 62 to the third conveyor 63, and the third conveyor 63 moves to (3, B). Further, a third substrate c is similarly loaded in the load area 21 during the mounting on the substrate b in the first mounting area M1.

Sequence (10)

The substrate a is conveyed from the third conveyor 63 to the fourth conveyor 64. Upon end of the mounting processing on the substrate b in the first mounting area M1, the substrates b and c are respectively conveyed to the second conveyor 62 and the first conveyor 61.

Sequences (11) to (13)

Upon receiving the substrate a, the fourth conveyor 64 stops its own conveying operation. Thus, a range of the mounting surface of the substrate a placed on the fourth conveyor 64 positioned at (3, C) becomes the second mounting area M2 described above, and the electronic component 13 is mounted on the substrate a by the mounting unit 80, for example. Moreover, the mounting processing on the substrate c placed on the first conveyor 61 is started in the first mounting area M1. In other words, in Sequences (11) to (13), mounting processing time periods in the first and second mounting areas M1 and M2 overlap. It is also possible to set the timings to start and end the mounting processing in the first and second mounting areas M1 and M2 to be substantially the same. It should be noted that in Sequence (12), a fourth substrate d is loaded in the load area 21.

Sequence (14)

Upon end of the mounting processing on the substrate a in the second mounting area M2, the substrate a is conveyed from the fourth conveyor 64 to the unload conveyor 66, and the substrate b is conveyed from the third conveyor 63 to the fourth conveyor 64. Moreover, the substrate c is conveyed from the first conveyor 61 to the second conveyor 62, and the substrate d is conveyed from the load conveyor 65 to the first conveyor 61.

Sequence (15)

The unload conveyor 66 moves from (3, D) to (2, D), and the substrate a is unloaded to the external apparatus. Further, the electronic components 13 are mounted on the substrates b and d in the second mounting area M2 and the first mounting area M1, respectively. It should be noted that in Sequence (15), a fifth substrate e is loaded in the load area 21.

As described above, in the Z-type flow, the substrate 9 is conveyed from the first conveyor 61 to the second conveyor 62 in the first area 31, and the substrate 9 is conveyed from the third conveyor 63 to the fourth conveyor 64 in the second area 32. As shown in Sequence (13), the substrates 9 stand by before the first and second mounting areas M1 and M2, for example. Specifically, in Sequence (13), because the load conveyor 65 is aligned with the first conveyor 61 and the third conveyor 63 is aligned with the fourth conveyor 64, the replacement times of the substrates 9 in the first and second mounting areas M1 and M2 can be shortened. In other words, unlike a mechanism of a mounting apparatus disclosed in Japanese Patent Application Laid-open No. 2007-227617 in which the substrates 9 are conveyed among conveyors only at the center column, the component mounting apparatus 1 can shorten the replacement times of the substrates 9 in the first and second mounting areas M1 and M2.

2. Descriptions on Parallel-Type Flow

Figure 7A:
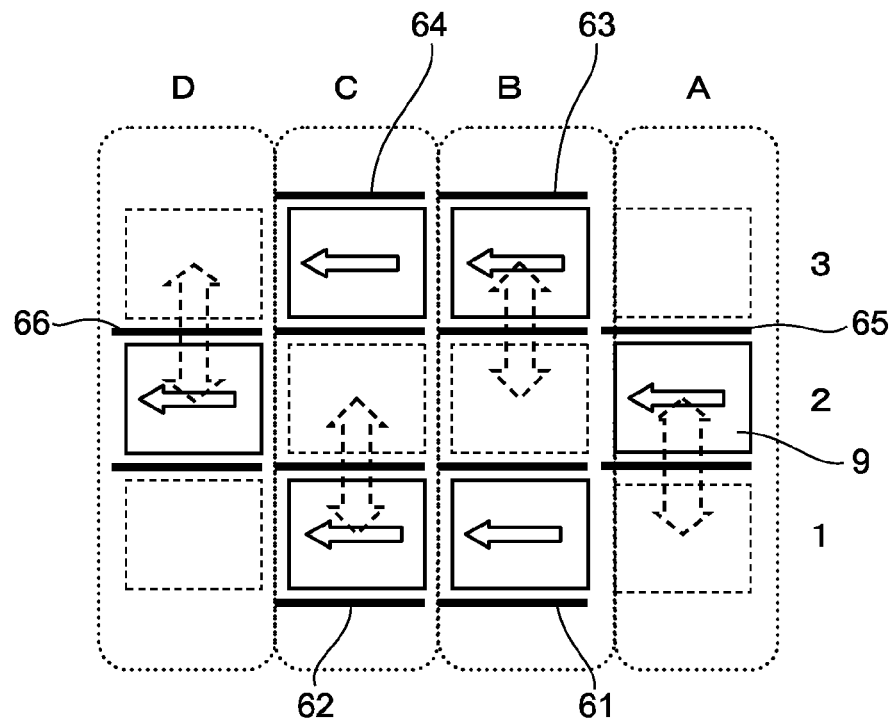
FIG. 7A is a diagram showing a moving range of each conveyor in a parallel-type flow.
Figure 7B:
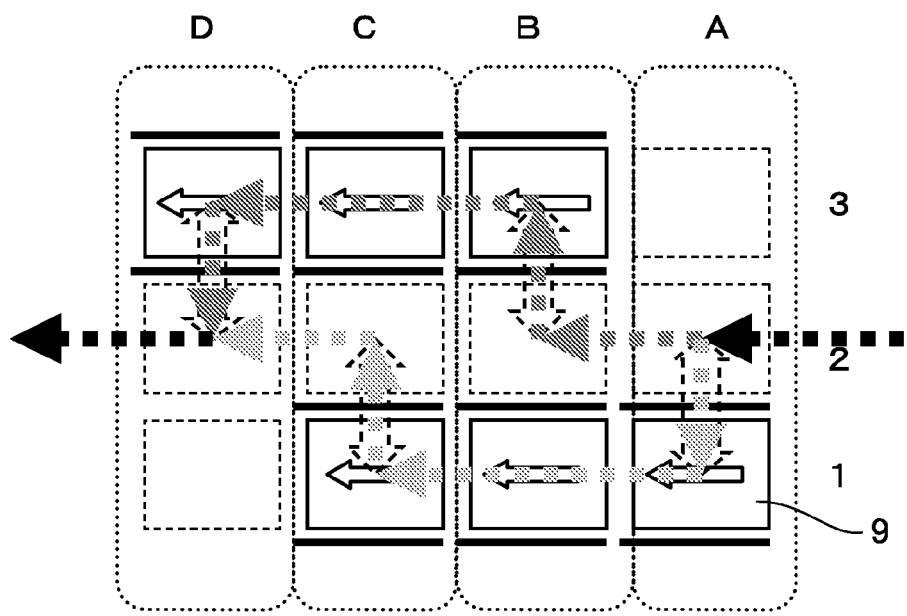
FIG. 7B is a diagram showing a direction in which two substrates flow in the parallel-type flow.

FIG. 7A is a diagram showing a moving range of each conveyor 60 in a parallel-type flow, and FIG. 7B is a diagram showing a direction in which two substrates 9 flow in the parallel-type flow.

The flow of FIG. 7A is different from the Z-type flow of FIG. 5A in that the second and third conveyors 62 and 63 convey the substrates 9 only in one direction in the Y-axis direction. As shown in FIG. 7B, in the parallel-type flow, one of the substrates 9 passes the first area 31, and the other one of the substrates 9 passes the second area 32.

Figure 8:
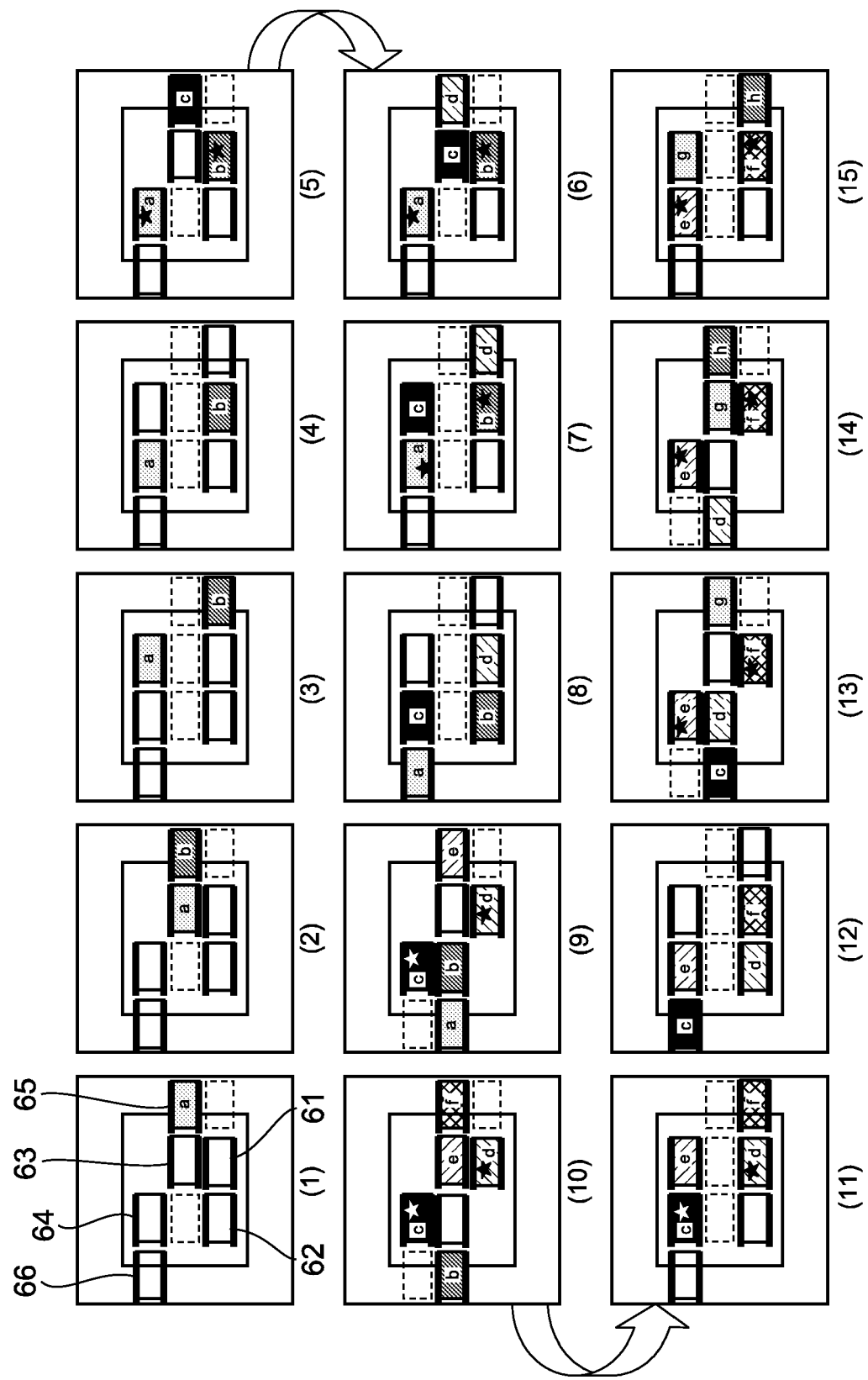
FIG. 8 is a diagram for specifically explaining the parallel-type flow.

FIG. 8 is a diagram for specifically explaining the parallel-type flow. It should be noted that in FIG. 8, time intervals of Sequences (1) to (15) are not necessarily constant.

Sequence (1)

As in FIG. 6, by the load conveyor 65 receiving the substrate a at (2, A), the first substrate a is loaded in the load area 21. The third conveyor 63 moves to the first buffer area 33a (2, B).

Sequence (2)

The substrate a is conveyed from the load conveyor 65 to the third conveyor 63, and the load conveyor 65 receives the second substrate b to load the substrate b in the load area 21.

Sequence (3)

The third conveyor 63 on which the substrate a is placed moves to (3, B), and the load conveyor 65 on which the substrate b is placed moves to (1, A).

Sequences (4) and (5)

The substrate a is conveyed from the third conveyor 63 to the fourth conveyor 64, and the substrate b is conveyed from the load conveyor 65 to the first conveyor 61. Thus, the range of the mounting surface of the substrate a placed on the fourth conveyor 64 becomes the second mounting area M2, and the mounting processing by the mounting unit 80 is started. In addition, the range of the mounting surface of the substrate b placed on the first conveyor 61 becomes the first mounting area M1, and the mounting processing by the mounting unit 70 is started. Moreover, in Sequence (5), the third substrate c is loaded in the load area 21.

Sequences (6) and (7)

In midst of the mounting processing in the first and second mounting areas M1 and M2, the third and fourth substrates c and d are loaded and conveyed as in Sequences (1) and (2). In Sequence (7), the substrates c and d stand by at (3, B) and (1, A), respectively.

Sequence (8)

Upon end of the mounting processing in the first and second mounting areas M1 and M2, the substrate a is conveyed from the fourth conveyor 64 to the unload conveyor 66, and the substrate b is conveyed from the first conveyor 61 to the second conveyor 62. In addition, as in Sequences (3) and (4), the substrates c and d are respectively conveyed to the fourth conveyor 64 and the first conveyor 61.

Sequence (9)

The unload conveyor 66 moves from (3, D) to (2, D), and the third conveyor 63 moves from (3, B) to (2, B). Further, the load conveyor 65 moves from (1, A) to (2, A), and the second conveyor 62 moves from (1, C) to (2, C). Accordingly, four conveyors are aligned on Row 2 in the middle. Furthermore, the mounting of the electronic components 13 on the substrates c and d are started in the first and second mounting areas M1 and M2, respectively. Then, the fifth substrate e is loaded in the load area 21.

Sequence (10)

In midst of the mounting processing in the first and second mounting areas M1 and M2, the substrate a is unloaded to the external apparatus, the substrate b is conveyed from the second conveyor 62 to the unload conveyor 66, the substrate e is conveyed from the load conveyor 65 to the third conveyor 63, and a sixth substrate f is loaded in the load area 21.

Sequence (11)

In midst of the mounting processing in the first and second mounting areas M1 and M2, the substrate b is unloaded from the unload conveyor 66 to the external apparatus. Then, the unload conveyor 66, the second conveyor 62, the third conveyor 63, and the load conveyor 65 move away from Row 2 in the middle.

Sequences (12) to (15)

Sequences (12) to (15) are the same flow as Sequences (8) to (11).

As described above, in the parallel-type flow, as shown in Sequences (7) and (15), the substrates 9 stand by before the first and second mounting areas M1 and M2 as in the case of the Z-type flow. Therefore, the replacement times of the substrates 9 in the first and second mounting areas M1 and M2 can be shortened.

In the example of FIG. 8, the odd-numbered substrates 9 pass the second area 32 and the even-numbered substrates 9 pass the first area 31. However, it is also possible for the odd-numbered substrates 9 to pass the first area 31 and the even-numbered substrates 9 to pass the second area 32.

3. Descriptions on X-Type Flow

Figure 9A:
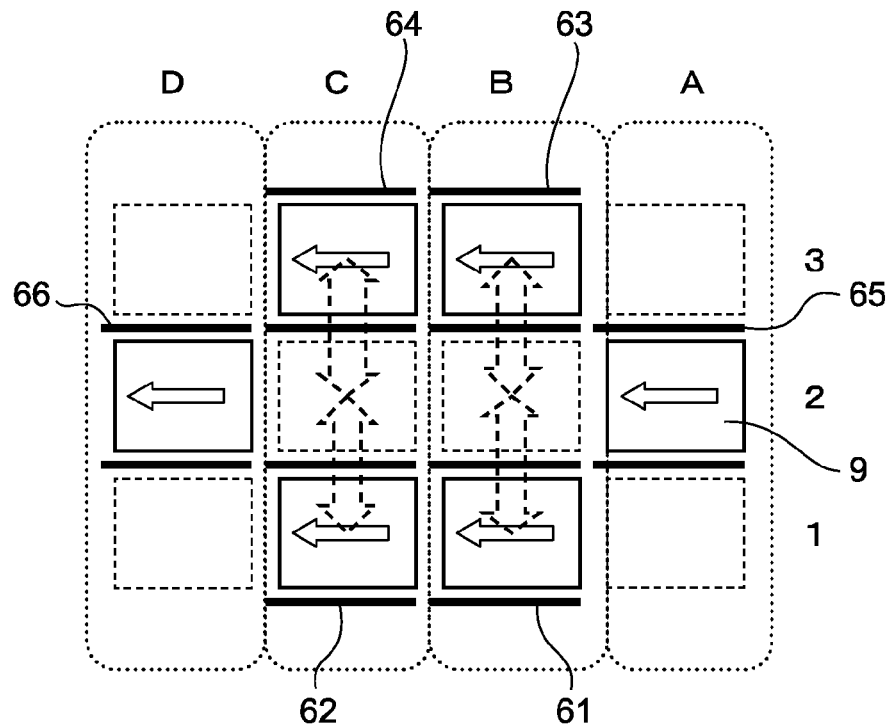
FIG. 9A is a diagram showing a moving range of each conveyor in an X-type flow.
Figure 9B:
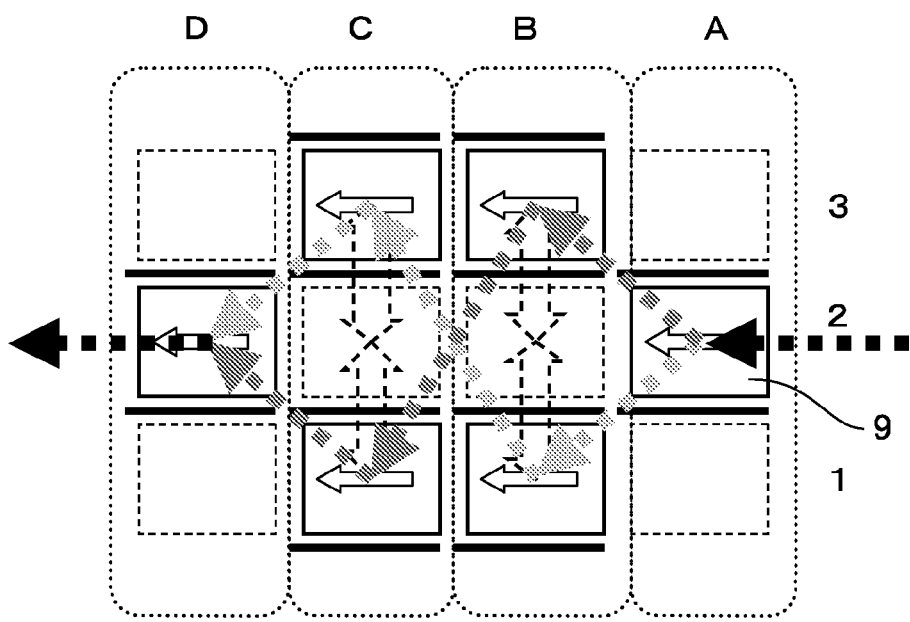
FIG. 9B is a diagram showing a direction in which two substrates flow in the X-type flow.

FIG. 9A is a diagram showing a moving range of each conveyor 60 in an X-type flow, and FIG. 9B is a diagram showing a direction in which the two substrates 9 flow in the X-type flow.

The flow of FIG. 9A is different from the Z-type flow of FIG. 5A in that the load conveyor 65 and the unload conveyor 66 are fixed at positions (2, A) and (2, D), respectively. As shown in FIG. 9B, in the X-type flow, the two substrates 9 move so as to cross each other.

Figure 10:
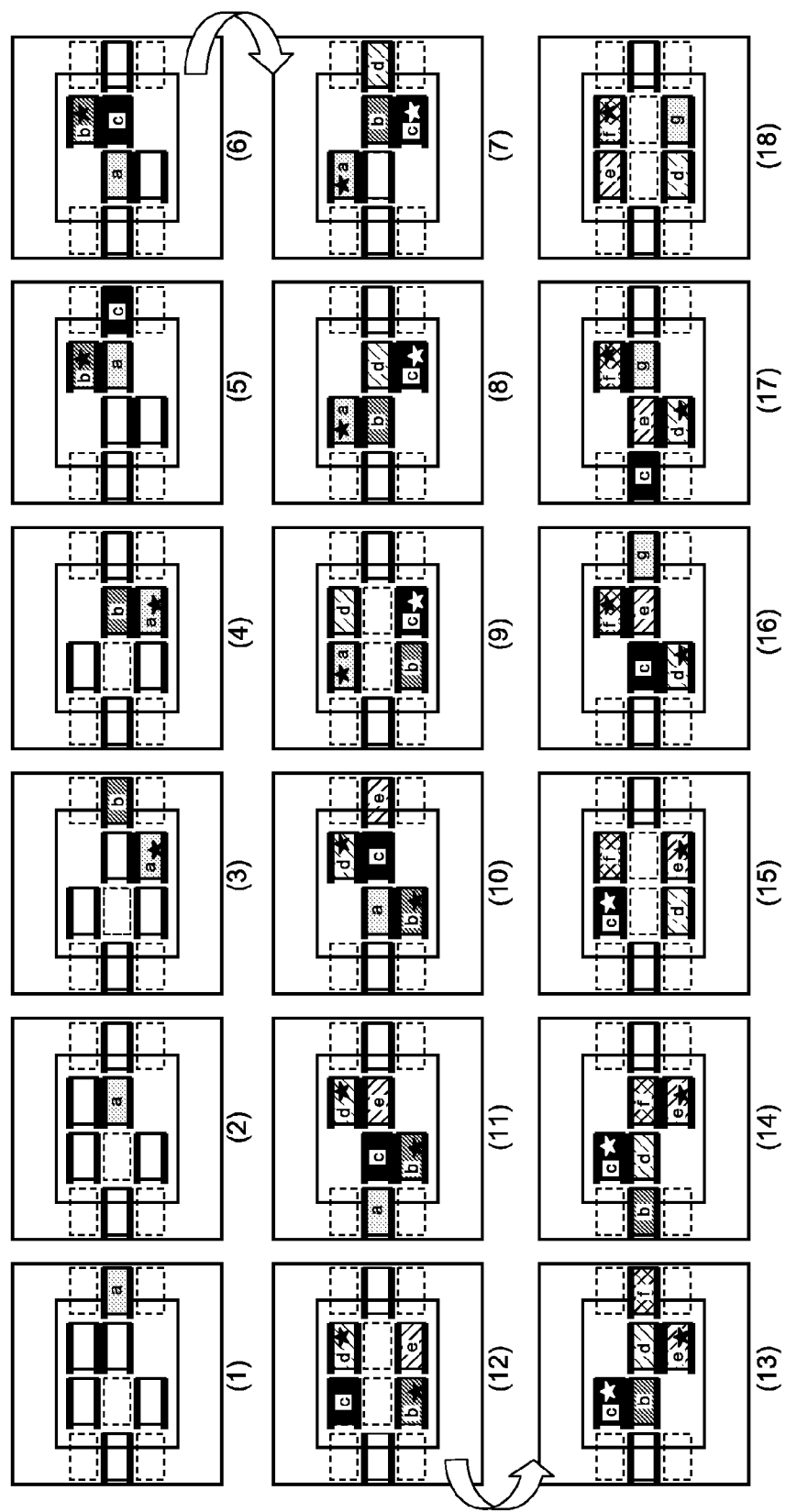
FIG. 10 is a diagram for specifically explaining the X-type flow.

FIG. 10 is a diagram for specifically explaining the X-type flow. It should be noted that in FIG. 10, time intervals of Sequences (1) to (18) are not necessarily constant.

Sequences (1) and (2)

The first substrate a is loaded in the load area 21, and the substrate a is conveyed from the load conveyor 65 to the first conveyor 61 positioned at (2, B).

Sequences (3) and (4)

The first conveyor 61 on which the substrate a is placed moves to (1, B), and the electronic component 13 is mounted on the substrate a by the mounting unit 70 at (1,B). Then, the second substrate b is loaded, and the loaded substrate b is conveyed to the third conveyor 63 that has moved to (2, B).

Sequence (5)

Upon end of the mounting processing on the substrate a, the first and third conveyors 61 and 63 move to (2, B) and (3, B), respectively. The electronic component 13 is mounted on the substrate b placed on the third conveyor 63 that has moved to (3, B) by the mounting unit 80. Then, the third substrate c is loaded in the load area 21.

Sequence (6)

In midst of the mounting processing on the substrate b, the substrate a is conveyed from the first conveyor 61 to the fourth conveyor 64 that has moved to (2, C), and the substrate c is conveyed from the load conveyor 65 to the first conveyor 61.

Sequence (7)

The fourth conveyor 64 on which the substrate a is placed moves to (3, C), the third conveyor 63 on which the substrate b is placed moves to (2, B), and the first conveyor 61 on which the substrate c is placed moves to (1, B). Then, the electronic component 13 is mounted on the substrate a by the mounting unit 80 at (3, C), and the electronic component 13 is mounted on the substrate c by the mounting unit 70 at (1, B).

Sequences (8) and (9)

In midst of the mounting processing on the substrates a and c, the substrate b moves to (1, C), and the fourth substrate d moves to (3, B).

Sequences (10) to (12)

The mounting unit 70 that has up to now carried out the mounting processing at (1, B) moves to (3, B), and the mounting unit 80 that has up to now carried out the mounting processing at (3, C) moves to (1, C). Then, the mounting processing on the substrates b and d is carried out. In midst of the mounting processing on the substrates b and d, the substrate a is unloaded to the external apparatus, and the substrate c and the fifth substrate e are respectively conveyed to (3, C) and (1, B).

Sequences (13) to (18)

The same flow as that of Sequences (7) to (12) is executed.

As described above, in the X-type flow, as shown in Sequences (9), (12), (15), and (18), the substrates 9 stand by before the first and second mounting areas M1 and M2 as in the case of the Z-type flow and the parallel-type flow. Accordingly, the replacement times of the substrates 9 in the first and second mounting areas M1 and M2 can be shortened.

Moreover, in the X-type flow, the first mounting area M1 in the first area 31 corresponds to both positions of (1, B) and (1, C), and the second mounting area M2 in the second area 32 corresponds to both position of (3, B) and (3, C). Accordingly, throughput is additionally improved as compared to the Z-type flow and the parallel-type flow.

Figure 11:
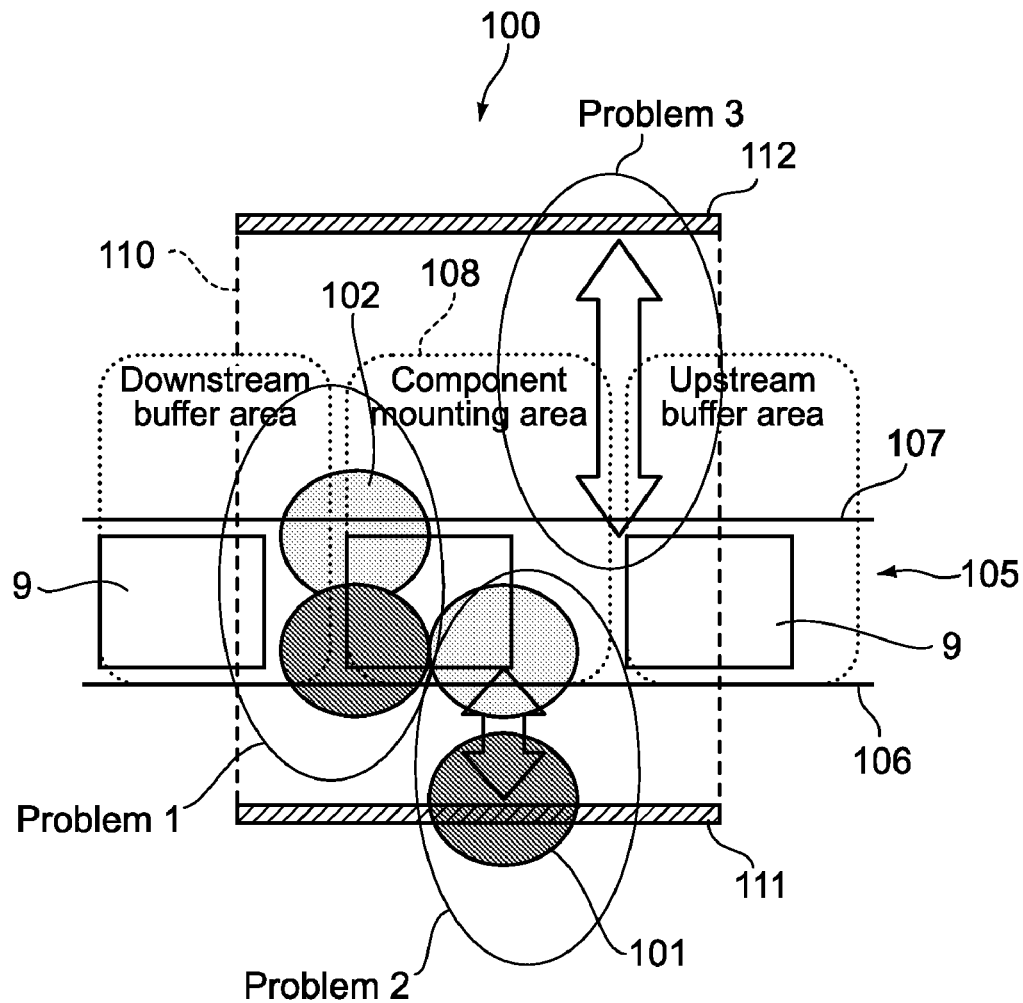
FIG. 11 is a schematic diagram showing a "2-head 1-substrate processing" mounting apparatus as a comparative example of the component mounting apparatus of this embodiment.

Incidentally, in the mounting apparatus of the related art that includes two heads, a single substrate 9 has been set as a target of the mounting processing, and the electronic components have been mounted only on that substrate 9. Hereinafter, this processing of the mounting apparatus will be referred to as "2-head 1-substrate processing". FIG. 11 is a schematic diagram showing the "2-head 1-substrate processing" mounting apparatus.

A "2-head 1-substrate processing" mounting apparatus 100 includes a front head 101 for extracting electronic components from the front side (lower side in FIG. 11), a rear head 102 for extracting the electronic components from the rear side, and a conveyor 105 for conveying the substrates 9 in a single row. The conveyor 105 includes two side plates 106 and 107 extending in a direction in which the substrates 9 flow, and the substrates 9 are conveyed within the two side plates 106 and 107. In FIG. 11, the substrates 9 are conveyed from right to left.

An area 110 boxed with a broken line is a movable area of the front head 101 and the rear head 102. A front end portion of the movable area 110 corresponds to a front-side component extracting position 111, and a rear end portion thereof corresponds to a rear-side component extracting position 112.

In the "2-head 1-substrate processing" as described above, there has been the following problems.

(Problem 1)

Because the two heads 101 and 102 cannot enter a component mounting area 108 in which the electronic components are mounted on a single substrate 9 at the same time, one of the heads 101 and 102 stands by while the other one of the heads 101 and 102 is carrying out the mounting processing. In addition, because it takes a longer time for one of the heads 101 and 102 to mount the electronic component on the substrate 9 than to extract the electronic component from the component supplying apparatus 14 (see FIG. 1), a large time loss occurs. In a case of a "1-head 1-substrate processing" mounting apparatus that includes a single head and targets a single substrate 9 for the mounting processing, for example, there is not much loss as the "2-head 1-substrate processing" mounting apparatus 100, and performance of each head is improved.

(Problem 2)

It is necessary that, when the front head 101 is at the front-side component extracting position 111, the rear head 102 can mount the electronic components on the entire mounting surface of the substrate 9. Therefore, the front head 101 cannot be positioned in the area in which the rear head 102 moves while carrying out the mounting processing. In other words, a sufficient distance needs to be provided between the front-side component extracting position 111 and the substrate 9 (about 200 mm in the case of the "2-head 1-substrate processing" mounting apparatus available from Sony Corporation), which thus deteriorates the performance.

(Problem 3)

The "2-head 1-substrate processing" mounting apparatus of a type capable of adjusting a width of the conveyor 105 in accordance with the width of the substrate 9 has the following problems. In the mounting apparatus of this type, the width of the conveyor 105 is adjusted by moving the rear-side side plate 107 of the conveyor 105 close to and away from the fixed front-side side plate 106. In a case of a small substrate 9, the rear-side side plate 107 is brought closer to the front-side side plate 106 and away from the rear-side component extracting position 112. Therefore, performance of the rear head 102 deteriorates. In addition, like Problem 1, because the two heads 101 and 102 alternately enter the mounting area to mount the electronic component on the substrate 9, the performance of the front head 101 becomes the same as that of the rear head 102.

(Problem 4)

In the case of the "1-head 1-substrate processing" mounting apparatus (not shown), the substrate 9 is replaced after the mounting of the component on the substrate 9 is ended, and the other head starts sucking a component simultaneous therewith. When one head includes 12 sucking nozzles as described above, for example, a time obtained by subtracting a time required for the head to suck 12 electronic components and return therewith from the time required for replacing the substrate 9 becomes a loss time caused in replacing the substrate 9. The time required for the head to suck 12 electronic components and return to the mounting area is about 1 sec, but it may take about 2 sec when a pattern that takes a longest component extracting time is selected.

In the case of the "2-head 1-substrate processing" mounting apparatus 100, however, one of the heads 101 and 102 waits for, after having extracted the component, the other one of the heads 101 and 102 to end the mounting processing. Therefore, the substrate replacement time is equivalent to the loss time caused when replacing the substrate. With production cycle times as short as about 20 sec that are becoming popular nowadays, a loss time difference of 2 sec causes a 10%-decrease in performance.

(Problem 5)

The replacement time of the substrate 9 described in Problem 4 is a time of a task of replacing the substrate 9 itself. A total time required for replacing the substrate 9 becomes a time as a sum of the replacement time and a time of a task for measuring a position of the substrate 9 with a camera, that is, a time required for recognizing a fiducial mark given to the substrate 9. The time required for recognizing two fiducial marks is generally about 0.4 sec, which is not a big problem in this case. However, in recent years, there are an increasing number of cases where a large number of fiducial marks are provided to a single substrate due to an increase in requisite mounting precision of electronic components, the cases of which correspond to a multiple-cutout substrate in which a single substrate 9 is cut out into a number of substrates afterwards, or marks for high-precision components only. In these cases, when there are 10 pairs of fiducial marks, for example, recognition thereof takes about 4 sec, which causes approximately a 20%-decrease in performance with respect to a cycle time that is as short as about 20 sec.

As a countermeasure of the five problems described above, a system called dual conveyor (not shown) is proposed. In the dual conveyor, two long conveyors are arranged in parallel on the front and rear sides. However, for each of the two conveyors, one receiving portion of the substrates 9 is provided on an upstream side and one discharging portion of the substrates 9 is provided on a downstream side. In the mounting apparatus that adopts such a system, the external apparatus connected to the mounting apparatus also needs to be provided with a total of four interfaces for the two receiving portions and the two discharging portions, thus resulting in poor general versatility.

The component mounting apparatus 1 of this embodiment can solve the five problems above. In addition, because the load conveyor 65 and the unload conveyor 66 that move in the Y-axis direction are respectively disposed in the load area 21 and the unload area 23, it is also possible to secure general versatility in the connection with the external apparatus.

Hereinafter, specifics in solving Problems 1 to 5 using the component mounting apparatus 1 will be described.

(Regarding Problem 1)

An analysis of performance of the "2-head 1-substrate processing" mounting apparatus 100 available from Sony Corporation shows that a ratio of a mounting time of an electronic component on the substrate 9 to the component extracting time is 55:45. A wait time occurs since one of the heads needs to wait for, after having extracted the component, the other head to end the mounting operation, whereby 45 as the component extracting time becomes 55 with an addition of the wait time. In other words, the equation of 55+45=100 becomes 55+55=110, thus causing a 9%-decrease in effective performance. Meanwhile, the 9%-decrease in the effective performance is eliminated in the component mounting apparatus 1 of this embodiment. Further, a 4%-decrease in catalogue performance is also eliminated likewise.

Z-type flow: 4%-increase in catalogue performance and 9%-increase in effective performance Parallel-type flow: 4%-increase in catalogue performance and 9%-increase in effective performance X-type flow: 4%-increase in catalogue performance and 9%-increase in effective performance (Regarding Problem 2)

In the case of the "2-head 1-substrate processing" mounting apparatus 100 available from Sony Corporation, it has been necessary to move the head 200 mm from the component mounting area 108 to the front-side component extracting position 111. In the component mounting apparatus 1 of this embodiment, however, the head only needs to move 100 mm, whereby the reciprocating time is shortened by 100 ms (50 ms for one-way movement). Because 12 electronic components are processed in a single reciprocating movement, a reduction in catalogue tact of 100/12=8 ms is realized. Since the catalogue tact is 160 ms, 160/(160−8)=1.06 is realized, thus resulting in a 6%-increase in catalogue performance.

Z-type flow: 6%-increase in catalogue performance

Parallel-type flow: 6%-increase in catalogue performance

X-type flow: 6%-increase in catalogue performance (Regarding Problem 3)

Considering the substrate 9 having a width of 160 mm, because the "2-head 1-substrate processing" mounting apparatus 100 available from Sony Corporation can handle a width of the substrate 9 of up to 460 mm, there is a 300-mm distance between the rear-side component extracting position 112 and the substrate 9. Since the reciprocating time is increased by 400 ms, a delay of 400/12=33 ms is caused per component. Assuming that an effective tact is 230 ms, in the component mounting apparatus 1 of this embodiment, 230/(230−33)=1.17 is realized, thus resulting in a 17%-increase in effective performance.

Z-type flow: 17%-increase in effective performance
 Parallel-type flow: 17%-increase in effective performance
 X-type flow: 17%-increase in effective performance
 (Regarding Problem 4)

In the case of the Z-type flow in the component mounting apparatus 1, it is assumed that the loss of the replacement times of the substrates 9 is shortened from 3 sec to 1.5 sec. In this case, considering an average production of a 30-sec cycle, (30−1.5)/(30−3)=1.06 is realized, thus resulting in a 6%-increase in effective performance.

Since the cycle time is doubled in the case of the parallel-type flow, (60−1.5)/((30−3)*2)=1.08 is realized, thus resulting in an 8%-increase in effective performance. "*" represents multiplication. The same holds true in descriptions below.

Since the loss of the replacement times of the substrates 9 becomes 0 in the case of the X-type flow, (30−0)/(30−3)=1.11 is realized, thus resulting in an 11%-increase in effective performance.

Z-type flow: 6%-increase in effective performance
 Parallel-type flow: 8%-increase in effective performance
 X-type flow: 11%-increase in effective performance
 (Regarding Problem 5)

The parallel-type flow in the component mounting apparatus 1 is effective. Normally, an image capturing time for two fiducial marks is about 0.4 sec, whereby (60−0.4)/((30−0.4)*2)=1.01 is realized, thus resulting in a 1%-increase in effective performance. It should be noted that it takes 4 sec to capture 20 fiducial marks in a particular case. In such a case, (60−4)/((30−4)*2)=1.08 is realized, thus resulting in an 8%-increase in effective performance.

Z-type flow: 0%-increase in effective performance
 Parallel-type flow: 1% (to 8%)-increase in effective performance
 X-type flow: 0%-increase in effective performance
 (Total Effect for Solving Problems 1 to 5)
 Z-type flow: 10%-increase in catalogue performance
 Parallel-type flow: 10%-increase in catalogue performance
 X-type flow: 10%-increase in catalogue performance
 Z-type flow: 35%*1.10 (catalogue performance improvement rate)=39%-increase in effective performance
 Parallel-type flow: 39%*1.10=43%-increase in effective performance
 X-type flow: 42%*1.10=46%-increase in effective performance Next, an embodiment on a width adjusting mechanism for adjusting the width of the conveyor 60 in the component mounting apparatus 1 will be described.

Figure 12:
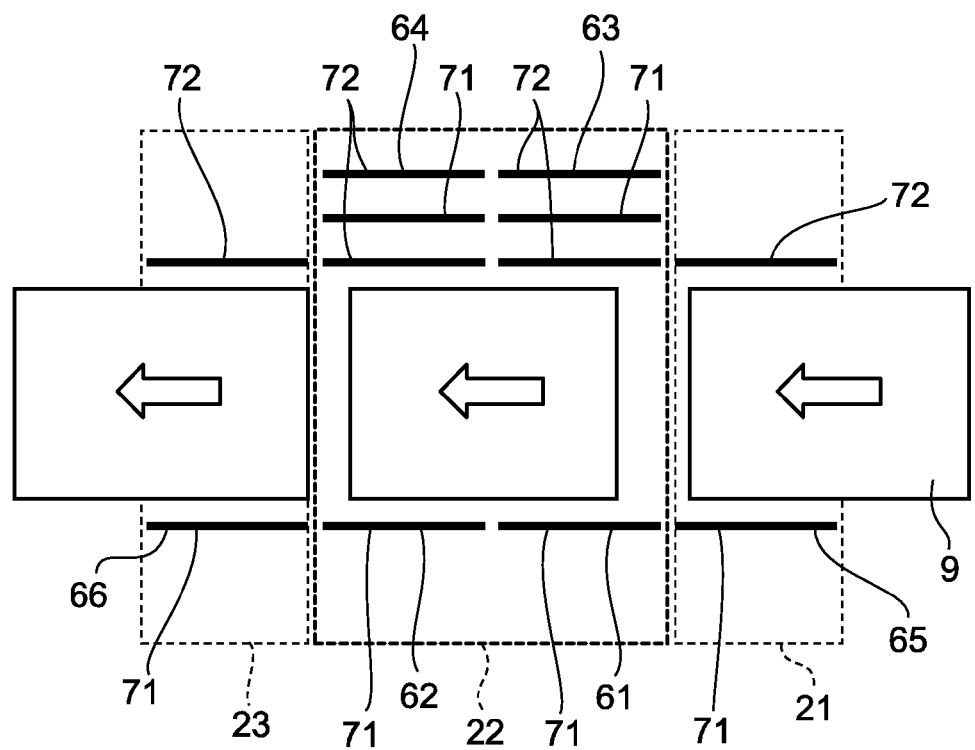
FIG. 12 is a schematic diagram showing a width adjusting mechanism for adjusting a width of the conveyor in the component mounting apparatus.

FIG. 12 is a schematic diagram showing an example of the width adjusting mechanism. For example, the width adjusting mechanism is structured such that, from the state shown in FIG. 2, the side plates 71 and 72 of the conveyor 60 on the first area 31 side (see FIG. 4) and the buffer area 33 side, respectively, move in the Y-axis direction in accordance with the width of the substrate 9. It is of course possible to move the third conveyor 63 and the fourth conveyor 64 instead of the first conveyor 61 and the second conveyor 62.

A width adjusting mechanism for a general conveyor can of course be used as the mechanism for realizing the width adjustment shown in FIG. 12, but it is also possible to use the following mechanism.

Figure 13:
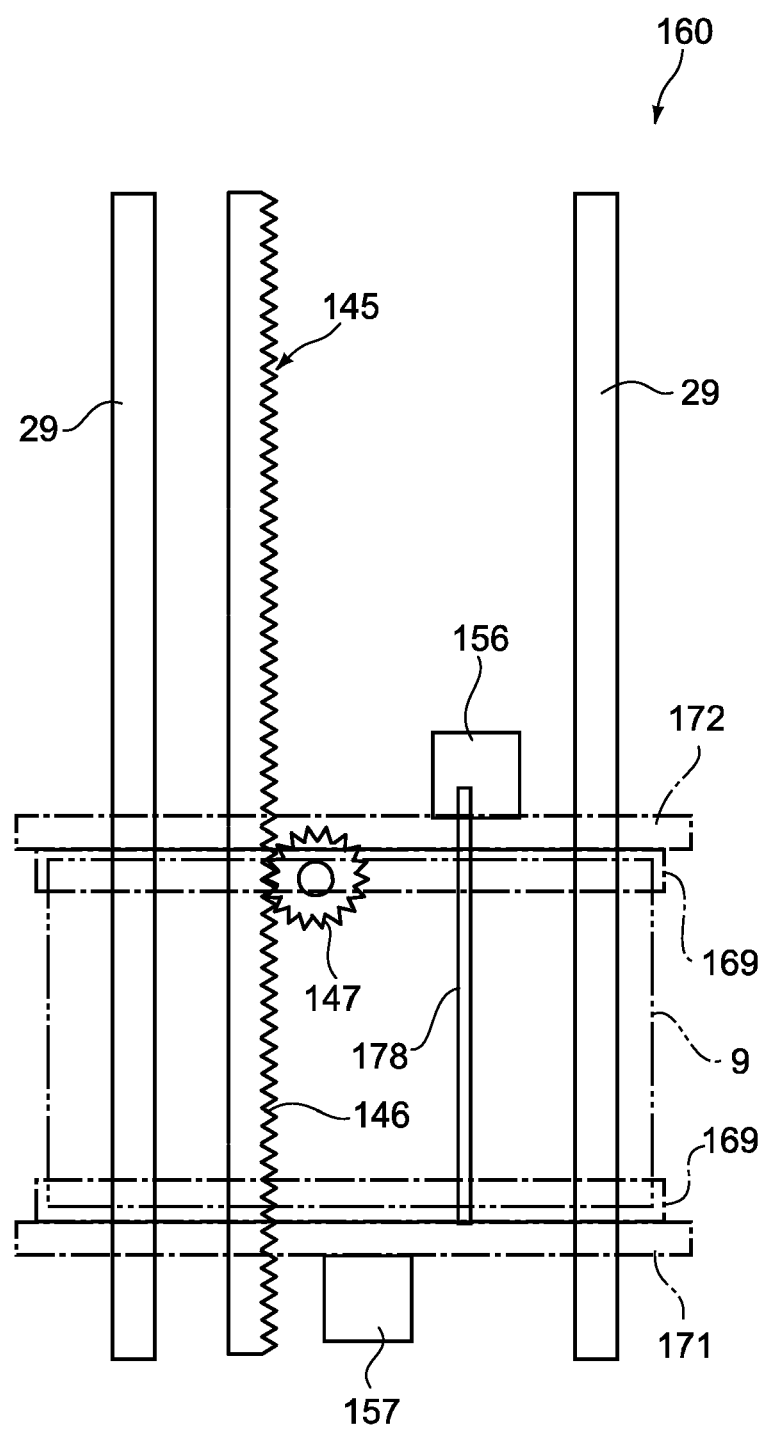
FIG. 13 is a schematic diagram showing the width adjusting mechanism of a conveyor apparatus according to the embodiment of the present invention.
Figure 13:
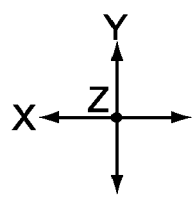

FIG. 13 is a schematic diagram showing a width adjusting mechanism of a conveyor apparatus 160 according to an embodiment of the present invention.

The conveyor apparatus 160 includes a conveyor portion 169 for supporting and conveying the substrate 9, a pair of side plates 171 and 172 (side members) disposed on both sides of the conveyor portion 169, and a connecting bar (connecting member) 178 for connecting the pair of side plates 171 and 172. The pair of side plates 171 and 172 is constituted of a first side plate 171 disposed on the front side and a second side plate 172 disposed on the rear side.

A well-known structure that is driven by a belt or a chain as described above only needs to be used for the conveyor portion 169.

Further, the conveyor apparatus 160 includes a first locking mechanism 156 for locking and unlocking the connection between the second side plate 172 and the connecting bar 178, and a second locking mechanism 157 for locking and unlocking the connection between the first side plate 171 and the base portion 2 as an installing portion (see FIGS. 1 to 3) (or a member (not shown) fixed to the base portion 2). The first locking mechanism 156 is attached to the second side plate 172, and the second locking mechanism 157 is attached to the base portion 2 (see FIGS. 1 to 3) or the member (not shown) fixed to the base portion 2.

One end portion of the connecting bar 178 on the first side plate 171 side is fixed to the first side plate 171, and the other end portion thereof is a free end with respect to the second side plate 172. When the first locking mechanism 156 is in a locked state, the connecting bar 178 and the second side plate 172 are fixed. For enabling the connecting bar 178 to move with respect to the second side plate 172, for example, the second side plate 172 includes a through-hole for guiding the connecting bar 178, or a guide portion that uses other mechanisms.

In addition, the conveyor apparatus 160 includes a conveyor driving unit 145. The conveyor driving unit 145 is capable of integrally moving the conveyor portion 169, the pair of side plates 171 and 172, the connecting bar 178, and the first locking mechanism 156 in the Y-axis direction. In descriptions below, the conveyor portion 169, the pair of side plates 171 and 172, the connecting bar 178, and the first locking mechanism 156 will collectively be referred to as "conveyor unit". The conveyor driving unit 145 includes, for example, a rack 146 and a pinion 147. The pinion 147 is connected with a servo motor (not shown). Not only the rack 146 and the pinion 147, but also various other mechanisms may be used for the conveyor driving unit 145.

The first locking mechanism 156 only needs to include members that respectively engage with the connecting bar 178 and the second side plate 172, or members for nipping the connecting bar 178 and the second side plate 172. For example, the first and second locking mechanisms 156 and 157 may be of a type in which the engagement is started or released by either an electromagnetic operation or a manual operation of an operator. Examples of the manual type operated by the operator include a ratchet type and a screw type, but are not limited thereto. The same type as the first locking mechanism 156 only needs to be used for the second locking mechanism 157 as well.

It should be noted that a configuration of the connecting bar 178 is not limited to a bar, and a configuration of the pair of side plates 171 and 172 is also not limited to a plate.

An operation of the thus-structured conveyor apparatus 160 will be described. FIGS. 14 and 15 are diagrams for explaining the operation.

Figures 14A, 14B:
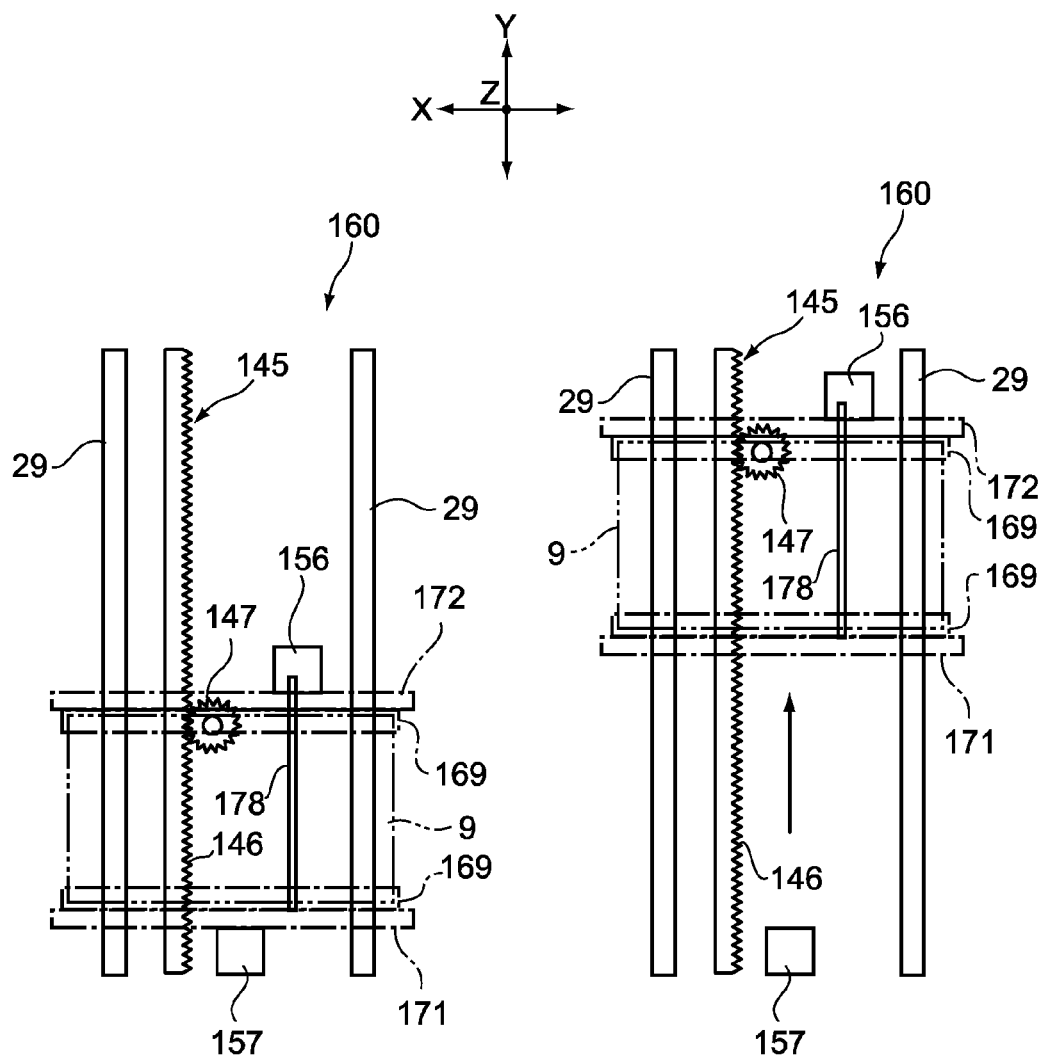
FIG. 14 are diagrams for explaining an operation of the conveyor apparatus shown in FIG. 13.

As shown in FIG. 14A, the first side plate 171 and the base portion 2 are locked by the second locking mechanism 157, and the second side plate 172 and the connecting bar 178 are locked by the first locking mechanism 156. In this state, the substrate 9 is conveyed in the X-axis direction.

As shown in FIG. 14B, by driving the conveyor driving unit 145 when the second locking mechanism 157 is in an unlocked state and the first locking mechanism 156 is in the locked state, the conveyor unit moves in the Y-axis direction.

Figure 15A:
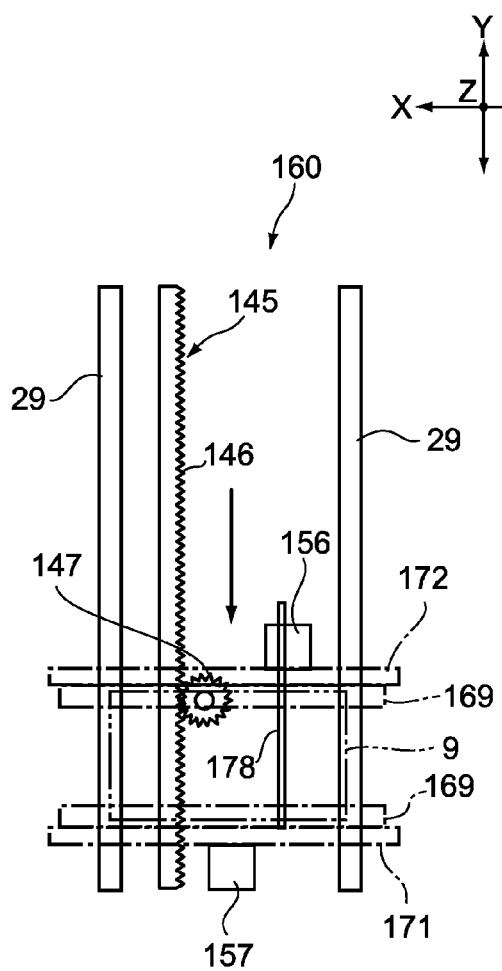
FIG. 15 are diagrams for explaining the operation of the conveyor apparatus shown in FIG. 13.
Figure 15B:
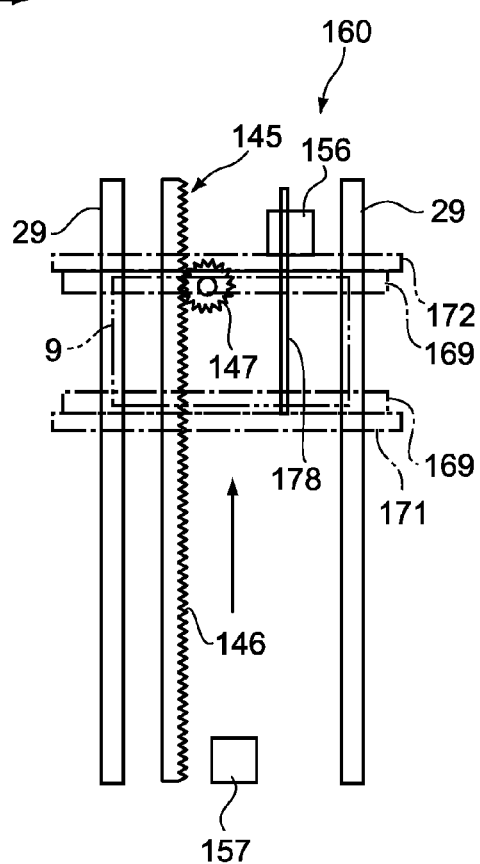

As shown in FIG. 15A, by driving the conveyor driving unit 145 when the second locking mechanism 157 is in the locked state and the first locking mechanism 156 is in the unlocked state, the second side plate 172 moves close to or away from the first side plate 171. Accordingly, a width as a distance between the pair of side plates can be adjusted. Moreover, as shown in FIG. 15B, by driving the conveyor driving unit 145 when the first locking mechanism 156 is in the locked state and the second locking mechanism 157 is in the unlocked state after the width adjustment, the width-adjusted conveyor unit moves in the Y-axis direction.

According to the thus-structured conveyor apparatus 160, the width can be easily adjusted in accordance with the width of the substrate 9 without any complicated mechanism.

In addition, the conveyor driving unit 145 can generate not only power for moving the conveyor unit, but also power for adjusting a width between the pair of side plates 171 and 172. Therefore, a driving mechanism for the width adjustment does not need to be additionally provided, whereby a reduction in size and simplification of the conveyor apparatus 160 can be realized.

The embodiment according to the present invention is not limited to the above embodiments, and various other embodiments may also be employed.

In the component mounting apparatus 1 of the above embodiments, the load area 21, the main area 22, and the unload area 23 are arranged in the X-axis direction extending from the load area 21 to the unload area 23, and the first area 31, the buffer area 33, and the second area 32 are arranged in the Y-axis direction orthogonal to the X-axis direction. However, the direction in which the load area 21, the main area 22, and the unload area 23 are arranged and the direction in which the first area 31, the buffer area 33, and the second area 32 are arranged do not have to be orthogonal and may cross obliquely.

In the Z-type flow and the parallel-type flow above, the load conveyor 65 moves between (2, A) and (1, A), and the unload conveyor 66 moves between (3, D) and (2, D). Moreover, in the X-type flow, the load conveyor 65 and the unload conveyor 66 are kept at (2, A) and (2, D), respectively. Therefore, in the conveyor driving unit for driving the load conveyor 65 and the unload conveyor 66, the linear guide rails 29 do not need to be provided fully in the Y-axis direction in the load area 21 and the unload area 23, for example.

In the above embodiment, three types of flows of the Z-type flow, the parallel-type flow, and the X-type flow are shown. However, the present invention is not limited to those flows, and various other flows may be applied to the component mounting apparatus 1.

In the above embodiments, the heads 35 are capable of moving in the Y-axis direction along the moving members 6 bridged between the beam 5 on the first area 31 side (front side) and the beam 5 on the second area 32 side (rear side) in the Y-axis direction, as shown in FIGS. 2 and 4, for example. In other words, the structure in which the heads 35 can move to the front side and also to the rear side is shown. However, the present invention is not limited to such a structure, and a structure in which one of the heads 35 moves in the X- and Y-axis directions only on the front side and the other one of the heads 35 move in the X- and Y-axis directions only on the rear side is also possible.

The present application contains subject matter related to that disclosed in Japanese Priority Patent Application JP 2008-100113 filed in the Japanese Patent Office on Apr. 8, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A conveyor apparatus, comprising:
   a conveyor portion to support and convey a substrate;
   a side member including a first side member and a second side member facially opposed to the first side member, the side member being connected to the conveyor portion such that the substrate supported by the conveyor portion is placed between the first side member and the second side member;
   a connecting member extending along a first direction that includes an end portion fixed to the first side member and connects the first side member and the second side member in a manner that the second member is movable along the connecting member towards or away from the first member along the first direction;
   a first locking mechanism that is attached to the second side member and locks and unlocks a connection between the second side member and the connecting member such that, in an unlocked state, the second member is movable along the connecting member towards or away from the first member and, in a locked state, the second member is immovable relative to the first member; and
   a driving unit operative to move the second side member along the first direction close to or away from the first side member when the first locking mechanism is in the unlocked state and operative to move the conveyor portion, the side member and the connecting member in unison along the first direction when the first locking mechanism is in the locked state.

2. The conveyor apparatus according to claim 1, further comprising
   a second locking mechanism to lock and unlock a connection between the first side member and an installing portion at which the conveyor apparatus is installed.

* * * * *